United States Patent
Smith et al.

(10) Patent No.: US 7,295,291 B2
(45) Date of Patent: Nov. 13, 2007

(54) APPARATUS AND PROCESS FOR THE DETERMINATION OF STATIC LENS FIELD CURVATURE

(75) Inventors: Adlai H. Smith, Escondido, CA (US); Robert O. Hunter, Jr., San Diego, CA (US)

(73) Assignee: Litel Instruments, San Diego, CA (US)

( * ) Notice: Subject to any disclaimer, the term of this patent is extended or adjusted under 35 U.S.C. 154(b) by 349 days.

(21) Appl. No.: 10/844,939

(22) Filed: May 12, 2004

(65) Prior Publication Data

US 2005/0254040 A1    Nov. 17, 2005

(51) Int. Cl.
  G01B 9/00    (2006.01)
  G03B 27/32   (2006.01)
  G03B 27/42   (2006.01)
  G03B 27/52   (2006.01)
  G03F 9/00    (2006.01)
  G03C 5/00    (2006.01)

(52) U.S. Cl. .................... 356/124; 355/53; 355/55; 355/77; 430/22; 430/30

(58) Field of Classification Search ............ None
See application file for complete search history.

(56) References Cited

U.S. PATENT DOCUMENTS

| | | | | |
|---|---|---|---|---|
| 5,300,786 A | * | 4/1994 | Brunner et al. | 250/548 |
| 5,402,224 A | * | 3/1995 | Hirukawa et al. | 356/124 |
| 5,615,006 A | * | 3/1997 | Hirukawa et al. | 356/124 |
| 5,978,085 A | * | 11/1999 | Smith et al. | 356/521 |
| 6,061,119 A | * | 5/2000 | Ota | 355/53 |
| 6,501,534 B1 | * | 12/2002 | Singh et al. | 355/55 |
| 6,602,727 B1 | * | 8/2003 | Rangarajan et al. | 438/14 |
| 6,606,152 B2 | * | 8/2003 | Littau et al. | 356/124 |
| 6,803,554 B2 | * | 10/2004 | Ye et al. | 250/208.1 |
| 7,099,011 B2 | * | 8/2006 | McArthur et al. | 356/401 |
| 7,126,668 B2 | * | 10/2006 | Smith et al. | 355/55 |
| 2002/0071112 A1 | * | 6/2002 | Smith et al. | 356/124 |

* cited by examiner

*Primary Examiner*—Gregory J. Toatley, Jr.
*Assistant Examiner*—Gordon J. Stock, Jr.

(57) ABSTRACT

A process for the determination of focal plane deviation uniquely due to the lens field curvature associated with a photolithographic projection tool is described. A series of lithographic exposures is performed on a resist coated silicon wafer using a stepper or scanner running in static mode. The lithographic exposures produce an array of focusing fiducials that are displaced relative to each other in a unique way. The resulting measurements are fed into a computer algorithm that calculates the lens field curvature in an absolute sense in the presence of wafer height variation and varying stage performance.

94 Claims, 26 Drawing Sheets

Notch angle = 270°

Notch angle = 180°

APPARATUS AND PROCESS FOR THE DETERMINATION OF STATIC LENS FIELD CURVATURE

BACKGROUND OF THE INVENTION

1. Field of the Invention

The present invention relates generally to processes for semiconductor manufacturing and, more particularly to optical lithography and the determination of focal plane deviation (FPD) associated with photolithographic projection systems.

2. Outline of the General Theory

The semiconductor industry's requirement to produce smaller critical features over time has forced semiconductor manufacturers and lithography tool vendors to produce higher numerical aperture (NA) lithography systems (Steppers or Scanners) using smaller wavelengths (for example, 193 nm DUV lithography). The ability to produce (manufacture) sub-wavelength features can often be determined by considering the rather simple (3-beam) Rayleigh scaling Resolution (R) and Depth-of-Focus (DoF) equations; $\sim\lambda/2NA$ and $\sim\lambda/2NA^2$ respectively. These coupled equations stress the inverse relationship between resolution and DoF based on the exposure wavelength ($\lambda$) and numerical aperture (NA)—for features printed near the limit of the optical system. High NA lithography has led to improved resolution and a reduction in the overall focus budget—making lithography processes difficult to control. See, for example, "Distinguishing Dose from Defocus for In-line Lithography Control", C. Ausschnitt, SPIE Vol. 3677, 140:147, 1999. Poor lithographic process control (focus and exposure) leads to smaller product yields, increased manufacturing costs, and poor time to market. While semiconductor lithographers have discovered creative reticle enhancement techniques (RETs) and other optical techniques to increase the useable DoF—the problem remains. See, for example, "The Attenuated Phase Shift Mask", B. Lin, and "Method and Apparatus for Enhancing the Focus Latitude in Lithography", Yan, U.S. Pat. No. 5,303,002 issued Apr. 12, 1994. Therefore, it is important to monitor focus during photolithographic processing and develop new methods for focus control. Typically focus error across a stepper field can be attributed to the following three factors: (1) wafer and reticle non-flatness, (2) wafer/reticle stage error, and (3) lens field curvature. For a photolithographic stepper, field curvature varies across the image field in x and y. There are many methods for determining/monitoring focal plane deviation (FPD) and best focus by field position for photolithographic exposure tools. See, for example, "Distinguishing Dose from Defocus for In-line Lithography Control", supra; "A Simple and Calibratable Method for the Determination of Optimal Focus", J. Gemmink, SPIE Vol. 1088, 220:230, 1989; "Astigmatism and Field Curvature from Pin-Bars", J. Kirk, SPIE, Vol. 1463, 282:291, 1991; "Photo-lithographic Lens Characterization of Critical Dimension Variation Using Empirical Focal Plane Modeling", M. Dusa, et al., SPIE, Vol. 3051, 1:10, 1997; "Latent Image Metrology for Production Wafer Steppers", P. Dirksen et al., SPIE, Vol. 2440, p. 701, 1995; "Controlling Focal Plane Tilt", S. Hsu et al., Semiconductor International—Online, 1998. None of these, however, accounts for wafer non-flatness independent of the lithographic process in an absolute sense. See, for example, "Competitive Assessment of 200 mm Epitaxial Silicon Wafer Flatness", H. Huff et al., SPIE, Vol. 3332, 625:630.

The ability to precisely control the photolithographic stepper tool depends on the ability to determine the magnitude and direction of the individual focusing error components (see items 1-3 mentioned above). While focusing error causes reduction in image fidelity, the coupling of focus error and other lens aberrations (distortions) degrades overlay or positional alignment as well. See, for example, "Impact of Lens Aberrations on Optical Lithography", T. Brunner.

Over the past 30 years the semiconductor industry has continued to produce faster (via smaller critical features) and more complex (greater functionality, dense patterning) circuits—year after year. See, for example, "Optical Lithography—Thirty Years and Three Orders of Magnitude", J. Bruning, SPIE, Vol. 3051, 1997. The push to smaller feature sizes is gated by many physical limitations. As the critical dimensions of semiconductor devices approach 50 nm, the usable DoF will approach 100 nm. See, for example, "2001 ITRS Roadmap", SEMATACH, 1:21. Continued advances in lithography equipment (higher NA systems, smaller wavelength exposure sources), RET's, resist processing, and automated process (focus and exposure) control techniques will likely become more difficult and remain critical. See, for example, "2001 ITRS Roadmap", supra; "The Waferstepper Challenge: Innovation and Reliability Despite Complexity", Gerrit Muller, Embedded Systems Institute Netherlands, 1:10, 2003.

FPD: There are a number of methods that, with greater or lesser accuracy, measure defocus or focal plane deviation (FPD) over an exposure field. In general terms, each of these techniques estimate the focal error across the field using a variety of special reticle patterns (focusing fiducials, FF), interferometric devices, mirrors, sensors, and statistical models. In addition, each of these methods utilizes the stepper wafer stage leveling and positioning system and/or optical alignment system to aide in the determination of FPD. FPD is a rather general term describing the complete focus error associated with the photolithographic stepper—deviations from the focal plane in reference to the wafer surface. Among other things, FPD can be caused by lens tilt, stage/reticle tilt, reticle bow and lens field curvature. FIG. 1 shows a generic photolithographic leveling system. FIG. 2 illustrates some common reticle patterns (the IBM Phase Shift Focus Monitor (PSFM), and the ASML FOCAL alignment mark) that are used to determine FPD for both steppers and scanners. Typically, FPD calibration/monitoring is performed daily or at least weekly to ensure that the stepper or scanner is operating within design limits (verifying the focus system works, the stage is level, etc.). While both techniques are Widely accepted, both techniques require complex calibrations to be performed at each field point. See, for example, "Detailed Study of Phase-Shift Focus Monitor", G. Pugh et al., SPIE, Vol. 2440, 690:700, 1995; "Latent Image Metrology for Production Wafer Steppers", supra.

Some FPD prior art methods are summarized below in Table 1:

| Method | Measurement Type | Comment |
|---|---|---|
| ISI (See, for example, "Apparatus Method of Measurement and Method of Data Analysis for Correction of Optical System", Smith et al., U.S. Pat. No. 5,978,085, Nov. 2, 1999) | Absolute | Extremely accurate. |
| FOCAL (See, for example, "Latent Image Metrology for | Relative | Published version claims high absolute |

-continued

| Method | Measurement Type | Comment |
|---|---|---|
| Production Wafer Steppers" supra) | | accuracy, resolution averaging in practice. |
| IBM focus monitor U.S. Pat. No. 5,300,786 | Absolute | Requires 'calibration'. It is very process independent. |
| Schnitzl (See, for example, "Distinguishing Dose from Defocus for In-Line Lithography Control", supra) | Relative with one exposure | Complex calibration, varying target sensitivity. |

ISI (Litel Instruments): A method for determining the aberrations of an optical system is described in U.S. Pat. No. 5,978,085 to Smith, in which a special reticle is used to determine the Zernike coefficients for photolithographic steppers and scanners. Knowing the wavefront aberration (Zernike coefficients and the associated polynomial) associated with the exit pupil of the projection system includes information about the lens field curvature or focus (Zernike coefficient a4, for example). Smith in the '085 patent uses a special reticle and a self-referencing technique to rapidly identify FPD to a high degree of accuracy (determines focusing errors to ~5 nm) in the presence of scanner noise. This method automatically determines lens field curvature information for both static and dynamic exposure tools (steppers and scanners).

PSFM: A method (called Phase Shift Focus Monitor) described by T. Brunner et al. in U.S. Pat. No. 5,300,786 entitled "Optical Focus Phase Shift Test Pattern, Monitoring System and Process", can be used to determine and monitor the focal plane deviation (FPD) associated with the lithographic process. More information can be found in, for example, "Detailed study of a phase-shift focus monitor", supra. In general, an alternating PSM with phase close to 90° possesses unusual optical properties that can be exploited to measure focus errors. See, for example, "Quantitative Stepper Metrology Using the Focus Monitor Test Mask",T. Brunner et al., SPIE, Vol. 2197, 541:549; "Using the Focus Monitor Test Mask to Characterize Lithographic Performance", R. Mih et al., SPIE, Vol. 2440, 657-666, 1995. It is possible to design a "box-in-box" overlay target using a phase shift mask pattern (referred to here as a focusing fiducial; see FIGS. 2 and 3), in which the measured overlay error is proportional to the focus error. Focal plane non-flatness is then determined by measuring the focusing fiducials across the lens field. Astigmatism information appears as differences between the delta-X overlay error and the delta-Y overlay error measurement. This technology has also been used for assessing variations in focus across the wafer due to lens heating, misfocusing near the edge of the wafer, and chuck/stage non-flatness. One major drawback with the PSFM method is that a fairly elaborate calibration procedure (focus offset vs. overlay shift for each field point) is required before it can be used—the PSFM technique is rather sensitive to the source-sigma (Na-source/Na-objective) that varies process to process. Additional PSM techniques, such as those found in, for example, "Focus Monitor for Alternating Phase Shifted Masks", Liebmann et al., U.S. Pat. No. 5,963,738 issued Aug. 10, 1999, are used in a similar way. While the PSFM method provides an FPD map across a scanner or stepper field, it does not provide a method for determining the dynamic lens field curvature independent of wafer height variation in the presence of stage synchronization error. See, for example, "Comprehensive Focus-Overlay-CD Correlation to Identify Photolithographic Performance", Dusa et al., SPIE, Vol. 2726-29, 1996.

FOCAL: A method called "FOCAL", for Focus determination using stepper alignment system, described by P. Dirksen, et. al., SPIE Vol. 2440, 1995, p. 701, specifies a focusing fiducial that can be used to find FPD and astigmatism across the exposure field (lens). FOCAL alignment marks (focusing fiducials) consist of modified wafer alignment marks (FIG. 1 of "Latent Image Metrology for Production Wafer Steppers", supra) that are measured using the stepper wafer alignment subsystem. Defocus of the tool results in an apparent shift of the center of the alignment mark relative to that of the "best focus" position. The FOCAL technique makes use of the exposure tool's alignment mechanism and therefore requires that the stepper or scanner be off-line for the length of the measurement sequence. FOCAL marks are sensitive to exposure and sigma like the PSFM method; however, since fiducial response is a function of pitch, the target features are less dependent upon reticle error. Furthermore, the FOCAL data (focus vs. overlay error) must be calibrated for every point in the exposure field similar to phase-shift monitors (typically at 121 points across an exposure field—see FIG. 11). Now, it is possible to use FOCAL to separate out lens tilt and astigmatism from dynamic FPD maps and provide a dynamic focal plane map, but wafer height variation and stage synchronization errors would still be included in the result See, for example, "193 nm Step and Scan Lithography", Davis et al., SEMI Technology Symposium 98, and "Comprehensive Focus-Overlay-CD Correlation to Identify Photolithographic Performance", supra.

Schnitzl Targets: A method described by Ausschnitt makes use of line-end shortening effects to decouple focus drift from exposure drift on semiconductor product wafers. See, for example, "Distinguishing Dose from Defocus for In-Line Lithography Control", supra. FIG. 3 shows a typical pair of Schnitzl targets (focusing fiducials). It is widely known that resist line-ends (FIG. 3) are very sensitive (exhibit greater line-end shortening) to both focus and exposure drifts; the effect is further enhanced as the lithographic process is pushed near performance limit of the scanner tool (~λ/2NA). Using the Schnitzl targets and a fairly elaborate method of calibration (CD-SEM measurements and a coupled system of equations), Ausschnitt offers a method that can determine the magnitude of focus drift on product wafers using one or more exposures in the presence of exposure drift. Since changes in focus and exposure can produce similar changes in the critical dimension (CD), the Schnitzl method is useful for day-to-day process monitoring because it eliminates the need to constantly perform focus and exposure experiments (such as FEM, a Focus Exposure Matrix) in-between production runs. In addition, the method uses fast and accurate optical overlay tools to measure the Schnitzl patterns (in several forms, CD targets or Overlay targets, FIGS. 2-3) after wafer processing. This saves monitoring costs because optical overlay tools are less expensive to operate as compared with a CD-SEM. While decoupling focus drift from exposure drift is useful for process monitoring, the method in its present form requires two exposures at different focus settings to determine the absolute focal drift (direction). Performing extra exposures during production runs is very costly. In addition, since the initial Schnitzl target calibration procedure depends on a number of lithographic tool settings (line size, pitch, sigma, NA) re-calibration is required for each lithographic process change— including changes in metrology tools. The Schnitzl focusing fiducials are often used to map out FPD across a stepper or scanner field, but methods similar to those in "Comprehensive Focus-Overlay-CD Correlation to Identify Photolithographic Performance", supra, would need to be implemented to obtain a dynamic focus map—but again, wafer height variation and scanning dynamics are not considered.

Summarizing:

Several methods for determining FPD have been described. Common to all of these methods is that a feature (a focusing fiducial or FF) is printed on a wafer and the focusing fiducial is subsequently measured. The data from the focusing fiducial is processed and an FPD value, δZ, determined. Further, and common to all these methods, the contributions of wafer height, lens aberrations (in the form of lens field curvature), and stage Z-error are not resolved into their distinct components.

SUMMARY

In accordance with the invention, lens field curvature for a lithographic projection system is determined by loading a reticle into a resist exposure tool of the system, loading a substrate into the resist exposure tool, exposing the substrate to an array of focusing fiducials on the reticle, wherein a corresponding first-array of focusing fiducials is imaged onto the substrate, shifting the substrate in a first shifting operation, exposing the substrate to the array of focusing fiducials on the reticle a second time, wherein a corresponding second array of focusing fiducials is imaged onto the substrate, shifting the substrate in a second shifting operation, exposing the substrate to the array of focusing fiducials on the reticle a third time, wherein a corresponding third array of focusing fiducials is imaged onto the substrate, measuring the focusing fiducials imaged onto the substrate, converting the measurements to one or more focal plane deviation values, and then calculating static lens field curvature using the one or more focal plane deviation values.

A series of lithographic exposures is performed on a resist coated silicon wafer using a photolithographic stepper. The lithographic exposures produce an array of focusing fiducials that are displaced relative to each other in a unique way. The focusing fiducials are measured and the focal plane distortion (FPD) is computed. The resulting measurements are fed into a computer algorithm that calculates the static lens field curvature in an absolute sense in the presence of wafer height variation and other wafer/reticle stage irregularities.

Other features and advantages of the present invention should be apparent from the following description of the preferred embodiments, which illustrate, by way of example, the principles of the invention.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

DETAILED DESCRIPTION

A process for the determination of lens field curvature uniquely associated with a photolithographic stepper is described. A series of lithographic exposures is performed on a resist coated silicon wafer using a photolithographic scanner. The lithographic exposures produce an array of focusing fiducials that are displaced relative to each other in a unique way. The focusing fiducials are measured and reduced to an FPD value. The resulting measurements are fed into a computer algorithm that calculates the static lens field curvature (SLFC) in an absolute sense in the presence of wafer height variation and stage Z-error.

Further Discussion and Related Art

It is desired to determine the performance of Static Lens Field Curvature (SLFC) resulting from design and construc tion imperfections in the projection imaging objective, projection lens, or lens. The focus of this invention is to describe a process for the proper determination of SLFC in the presence of wafer height variation, ZW(x,y).

We define δz(x, y) as the net focal deviation or focal plane deviation (FPD) at wafer plane located at (x, y). This can be determined a variety of ways. Vide infra. We can decompose δZ(x, y) into contributions from the lens, the wafer stage and the wafer as:

$$\delta Z(x, y) = ZL(XF, YF) + ZS + \theta X^* XF + \theta Y^* YF + ZW(x, y) \quad \text{(Equation 1)}$$

where:

(XF,YF)=intrafield coordinates. These are the lens field coordinates.

The position (0,0) is the lens optical axis position.

ZL(XF,YF)=static lens field curvature (SLFC).

ZS,θX,θY=wafer stage induced piston (Z-shift), X-tilt and Y-tilt.

ZW(x, y)=wafer flatness or height variation.

(x, y)=wafer coordinates=(XFC+XF, YFC+YF) where (XFC, YFC) are the center of the projection field or lens optical axis in wafer coordinates.

DISCUSSION OF FIRST EMBODIMENT

In accordance with the present invention, Focusing Fiducials (FF) are exposed on a wafer in such a manner that we can isolate and eliminate the effects of wafer height variations and get a true measure of static lens field curvature (SLFC).

Figure 7:
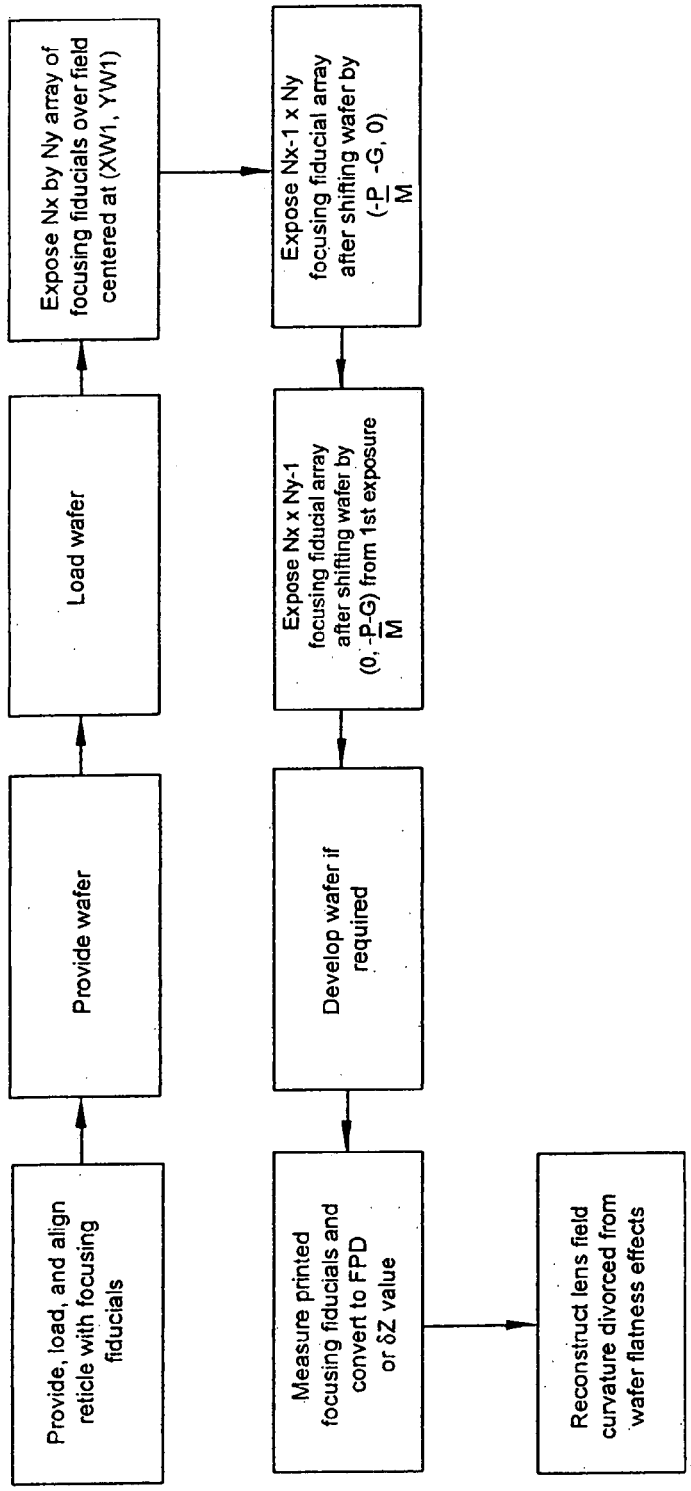
FIG. 7 shows process flow for a system constructed in accordance with the present invention.
Figure 8:
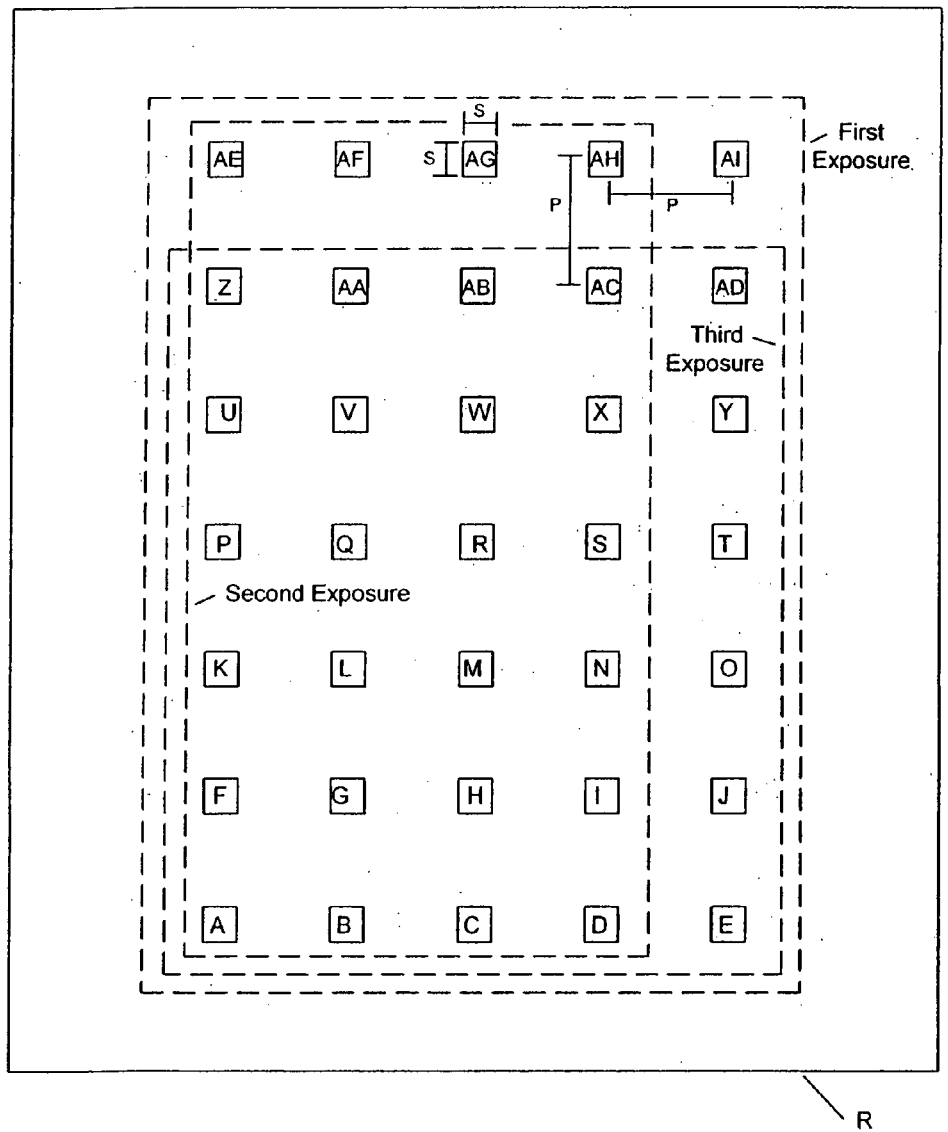
FIG. 8 shows a schematic of a FF reticle.

A process flow diagram for a system constructed in accordance with the present invention is shown in FIG. 7. A schematic of a reticle containing an Nx*Ny (Nx=5, Ny=7) array of focusing fiducials is shown in FIG. 8.

Provide Load and Align Reticle

Figure 5:
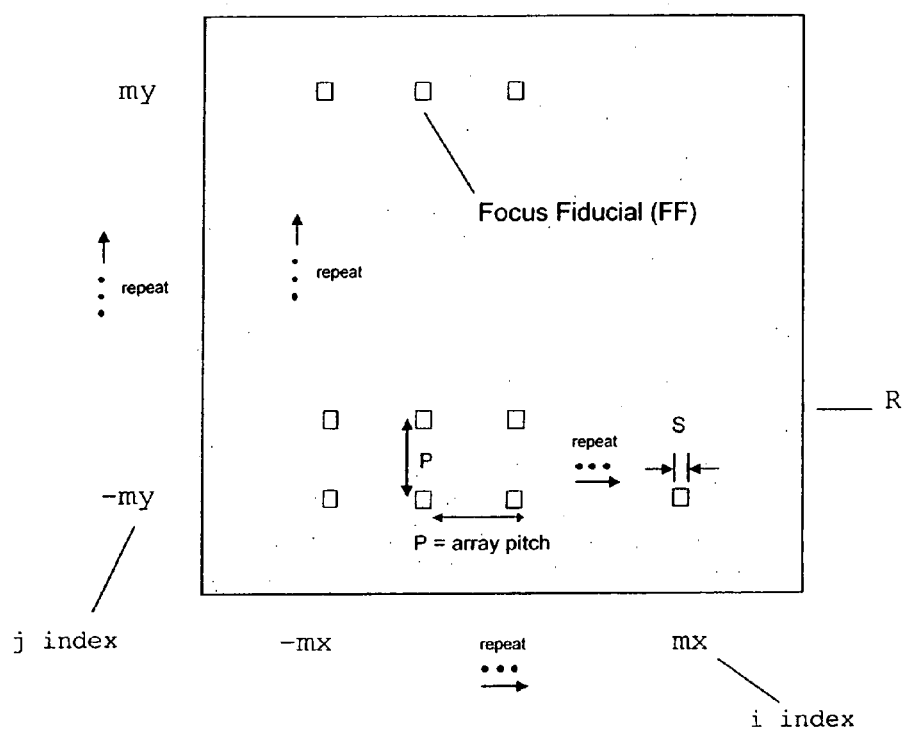
FIG. 5 shows a schematic of a focusing fiducial reticle.

A focusing fiducial reticle is provided. The exact form taken depends on the technology employed (vide supra), but they are schematically represented in FIG. 5 as a (2mx+1)*(2my+1) array of focusing fiducials (FF) on a pitch or spacing equal to P. The size or extent of each individual FF is S.

A schematic focusing fiducial reticle is shown in FIG. 5. It consists of a rectangular array of focusing fiducials on a pitch or spacing=P; each focusing fiducial generically represented by a square. The exact form of the focusing fiducial will depend on the technique applied by each individual user. A list of technologies and examples of focusing fiducials is provided in the following table, Table 2.

TABLE 2

Figure 1:
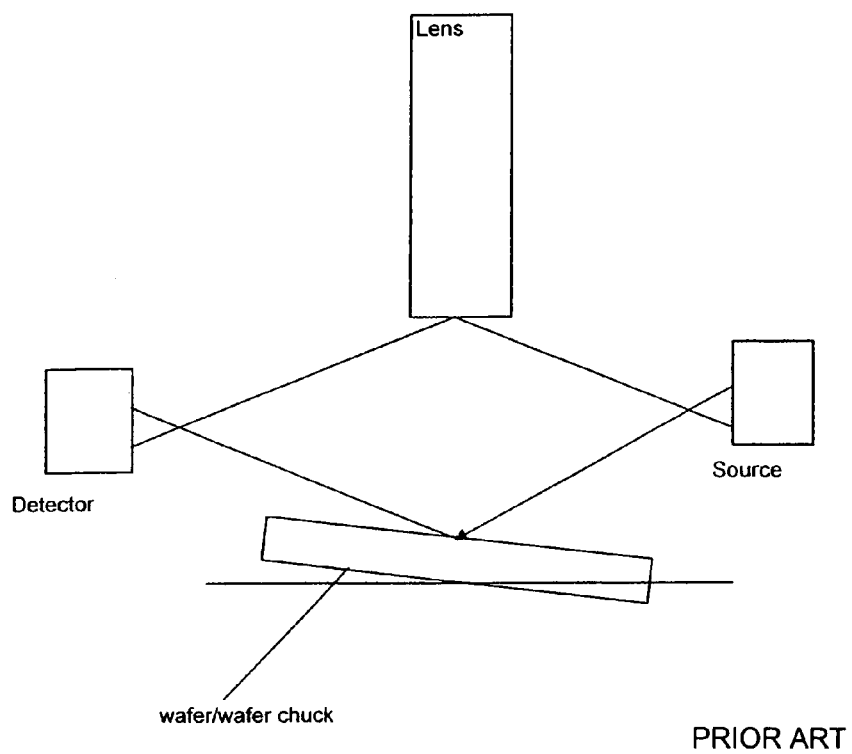
FIG. 1 generic wafer/stage leveling system with detector and source.
Figure 2:
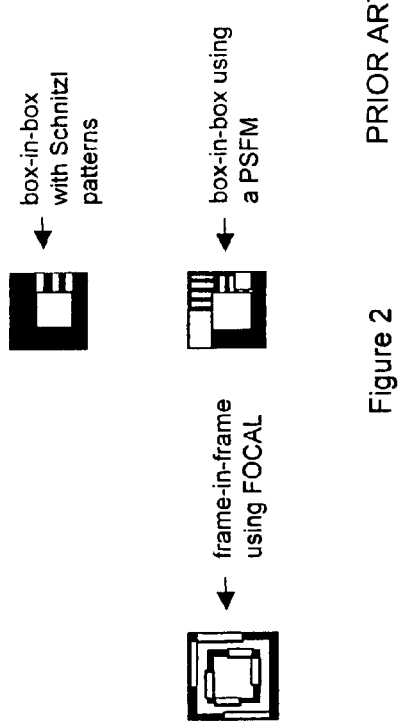
FIG. 2 shows typical focusing fiducials for; FOCAL, PSFM, and Schnitzl methods.
Figure 3:
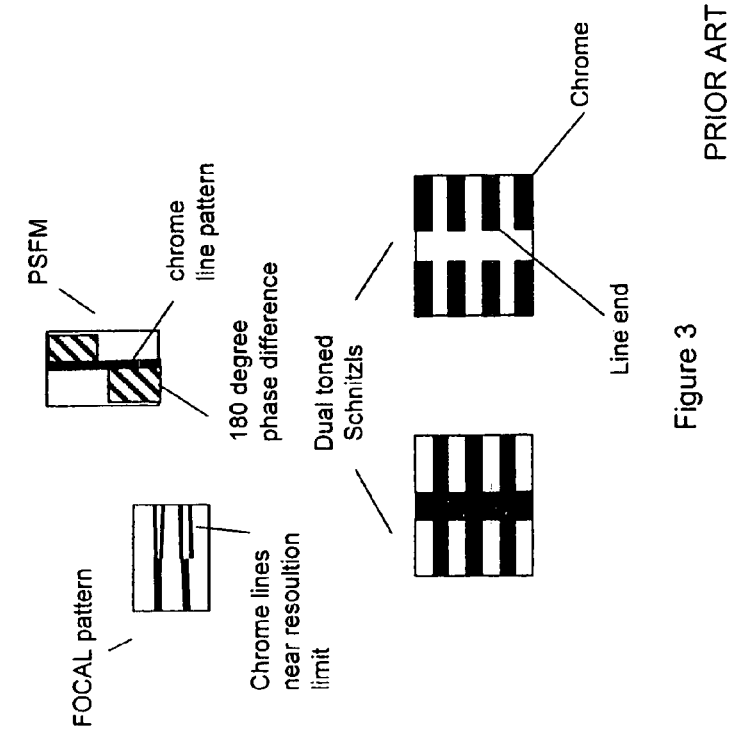
FIG. 3 shows typical focusing fiducials (FF) for FOCAL, PSFM, and Schnitzl.
Figure 9:
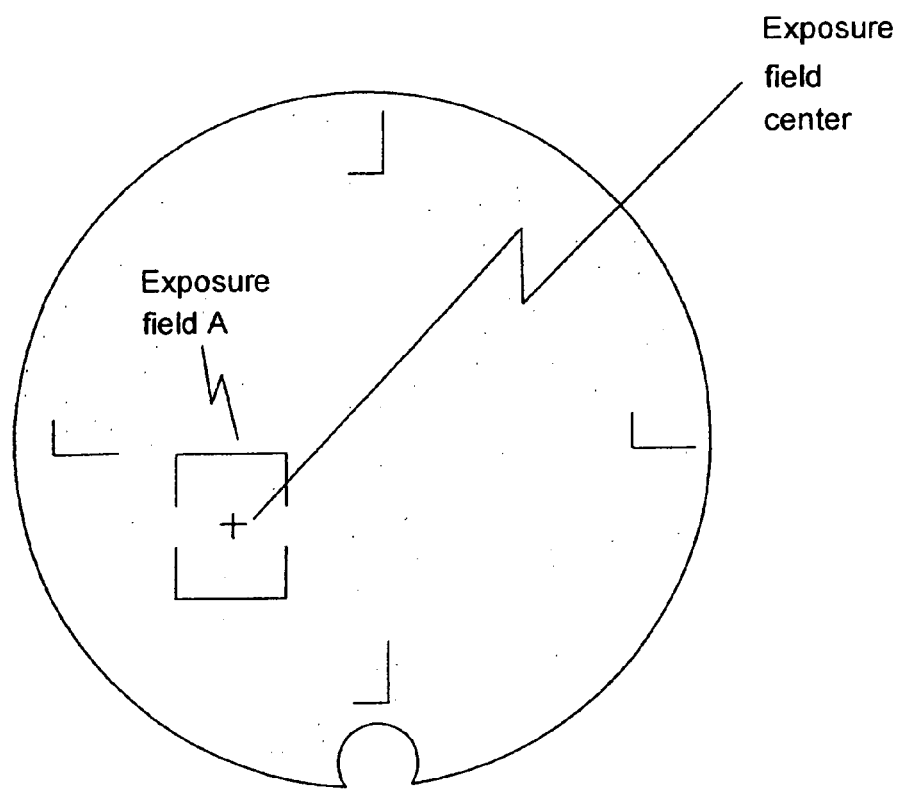
FIG. 9 shows wafer level view of a single field exposure.

| Technology | Sample Focusing Fiducial | Comment |
| --- | --- | --- |
| PSFM (Phase shift focal monitor) | FIG. 1a of "Using the focus monitor test mask to characterize lithographic performance", R. D. MIH et. al., SPIE vol 2440 pg 657; 1995. | Results in box-in-box structure suitable for reading an overlay metrology tool. |
| PSFM (Phase shift focal monitor) | FIG. 6 of "Optical Focus Phase Shift Test Pattern, Monitoring System and Process", Brunner et al., U.S. Pat. No. 5,300,786 issued Apr. 5, 1994. | Only x direction structure shown. This can be used but to minimize astigmatism effects, a structure rotated by 90° should also be included on the reticle. |
| PSFM (Phase shift focal monitor) | FIG. 7 of U.S. Pat. No. 5,936,738 supra. | |
| PSFM (Phase shift focal monitor) | FIG. 7 of U.S. Pat. No. 5,936,738, supra. | |
| PSFM (Phase shift focal monitor) | FIG. 9 of U.S. Pat. No. 5,936,738, supra. | |
| PSFM (Phase shift focal monitor) | FIG. 10 of U.S. Pat. No. 5,936,738, supra. | |
| FOCAL | FIG. 1 of "Latent Image Metrology for Production Wafer Steppers", supra. | Use 'LIM' mark. |
| Schnitzl | FIG. 25 of "Segmented Bar-in-Bar Target", Ausschnitt, U.S. Pat. No. 6,137,578 issued Oct. 24, 2000. | |
| Schnitzl | FIGS. 26a, 26b, 27a, 27b, 28a, 28b of U.S. Pat. No. 6,137,578 supra. | Each of these figures is a variation of FIG. 25 (same reference). |
| Line End Shortening | FIGS. 1 and 2 of "Automatic In-Situ Focus Monitor Using Line Shortening Effect", Kim et al., SPIE Vol. 3677, March 1999. | |
| ISI | FIG. 4 of "Apparatus, Method of Measurement, and Method of Data Analysis for Correction of Optical system", Smith et al., U.S. Pat. No. 5,828,455 issued Oct. 27, 1998. | FIG. 5 of the same reference shows printed feature on wafer. |

The reticle is loaded and aligned on the stepper.

Provide Wafer

Figure 4:
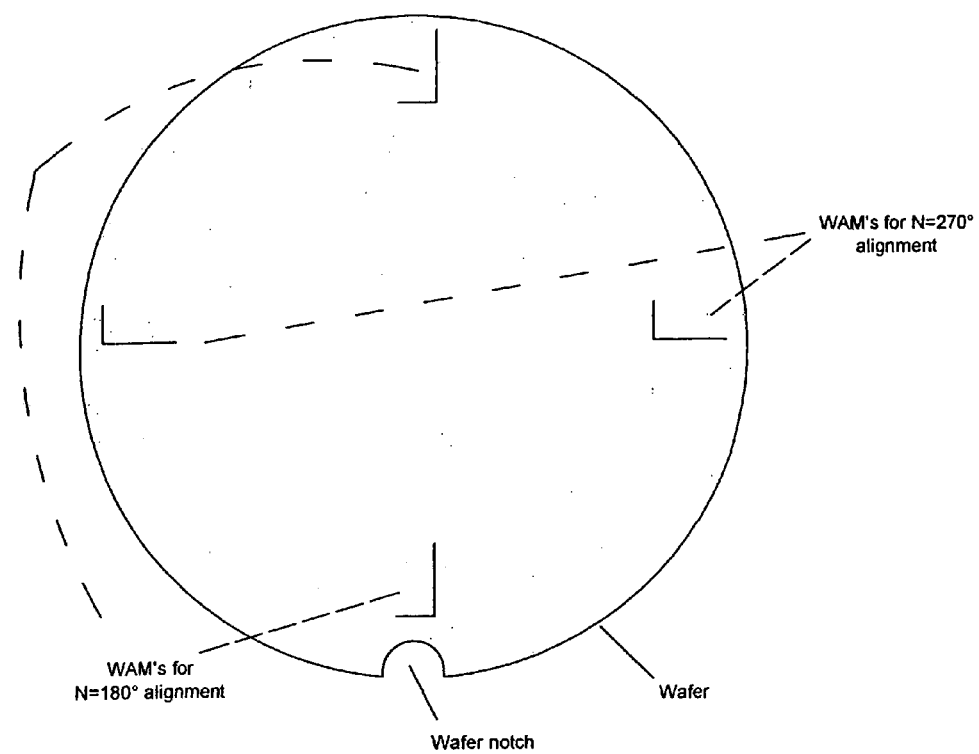
FIG. 4 shows wafer with wafer alignment marks (180° and 270°).

A resist coated wafer is provided (FIG. 4). Wafer alignment marks (WAM) are not required.

Load Wafer

The wafer is then loaded into a resist exposure tool, such as stepper. Wafer alignment is not required.

First Exposure

A reticle (R) containing an array of focusing fiducials (FF) at Nx=2mx+1, Ny=2my+1 sites (FIG. 8) is exposed onto the wafer, thereby forming an exposed field (FIG. 10 with mx=2, my=3), where the projection of the individual focusing fiducial field points are labeled by the unprimed letters A: AI, that correspond one for one with the FFs on the reticle of FIG. 8. There, the region of reticle R used for the first exposure is indicated. In the following, we discuss the case where Nx and Ny are odd numbers, Nx=2mx+1, Ny=2my+1. The foregoing can be readily generalized to mixed odd-even, even-odd and even-even (NX-NY) configurations. This first exposure is done with the field centered at position (XW1, YW1) on the wafer. A schematic of the exposed field is shown at the wafer perspective level in FIG. 9. Indices i and j indicate position with respect to the center of the first field and are $$[X1(i), Y1(j)] = \left(i * \frac{P}{M}, j * \frac{P}{M}\right)$$

Also, the lens field positions (XF,YF) for the first exposure are:

$$[XF(i), YF(i)] = \left(i * \frac{P}{M}, j * \frac{P}{M}\right) \quad \text{(Equation 2)}$$

Figure 6:
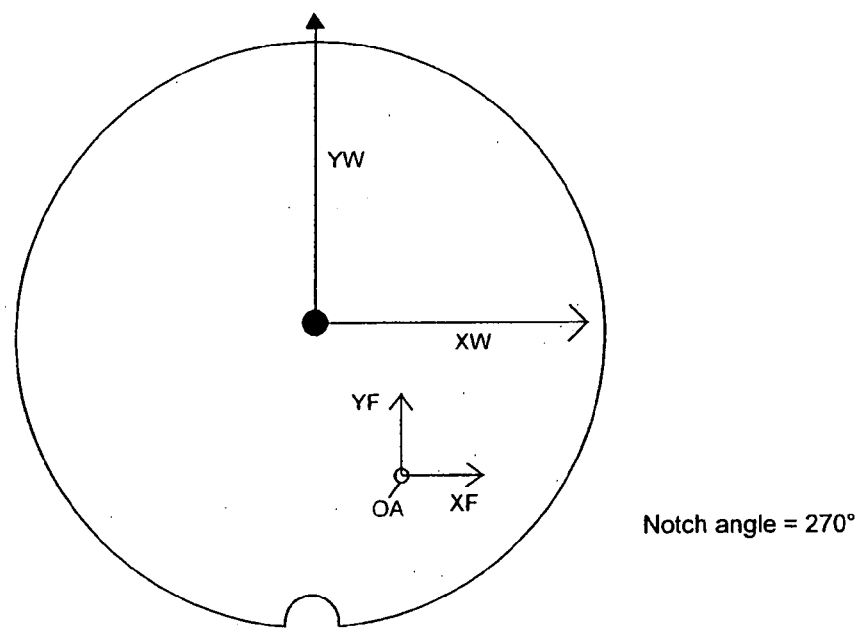
FIG. 6 shows the wafer, field coordinates and wafer notch angles.
Figure 6:
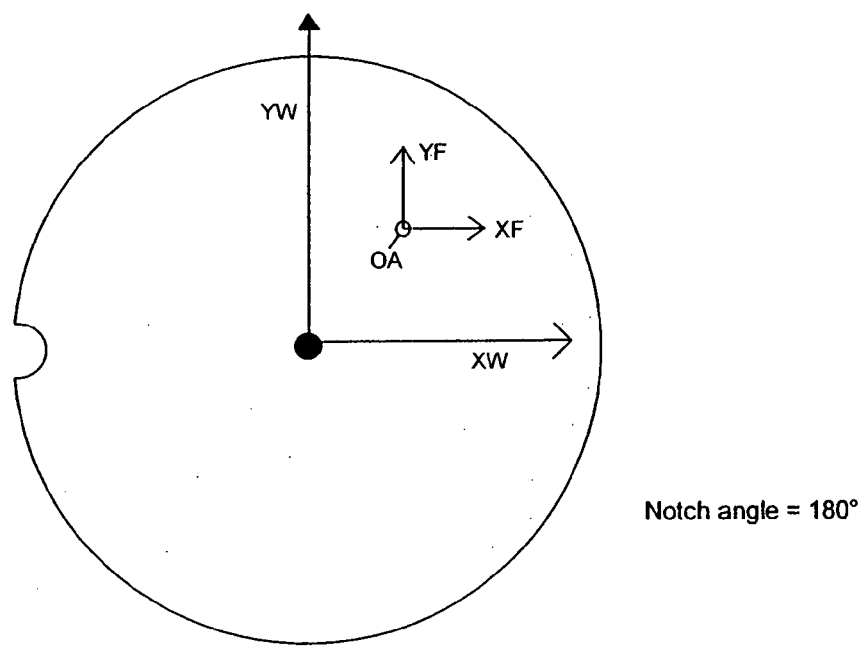

FIG. 6 outlines the relation of wafer coordinates (XW, YW) to lens field coordinates XF, YF.

Second Exposure

Figure 11:
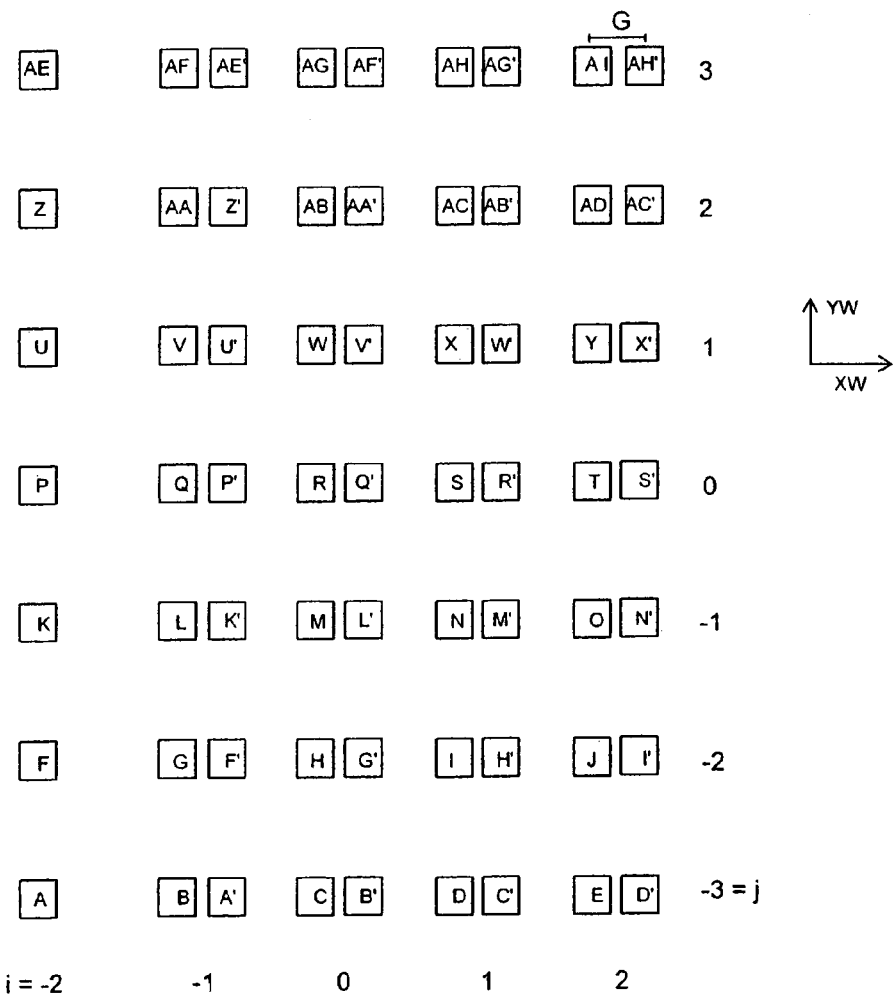
FIG. 11 shows a schematic field after a second exposure series.

The wafer is now shifted $$(\Delta X, \Delta Y) = \left(-\frac{P}{M} - G, 0\right)$$

and the portion of the reticle indicated by 'second exposure' in FIG. 8 printed on the wafer. M is the reduction magnification of the projection imaging tool (M=4 to 5 typically). Referring to FIG. 11, printed focusing fiducials A':D', F':I', K':N', P':S', U':X', Z':AC' and AE':AH' corresponding to reticle focus fiducials A:D, F:I, etc. of FIG. 8 are shown separated by a distance G from one another (FIG. 11). The offset G is chosen so the focusing fiducials remain distinct and useable but the wafer flatness does not vary significantly over an interval of the size G. Since G is typically <1 mm at the wafer, only the higher frequency spatial variations contribute. Since the power spectral density of wafer flatness falls off rapidly at higher spatial frequencies, the variation over sizes <1 mm will typically be small ($\leq$10 nm).

Third Exposure

Figure 12:
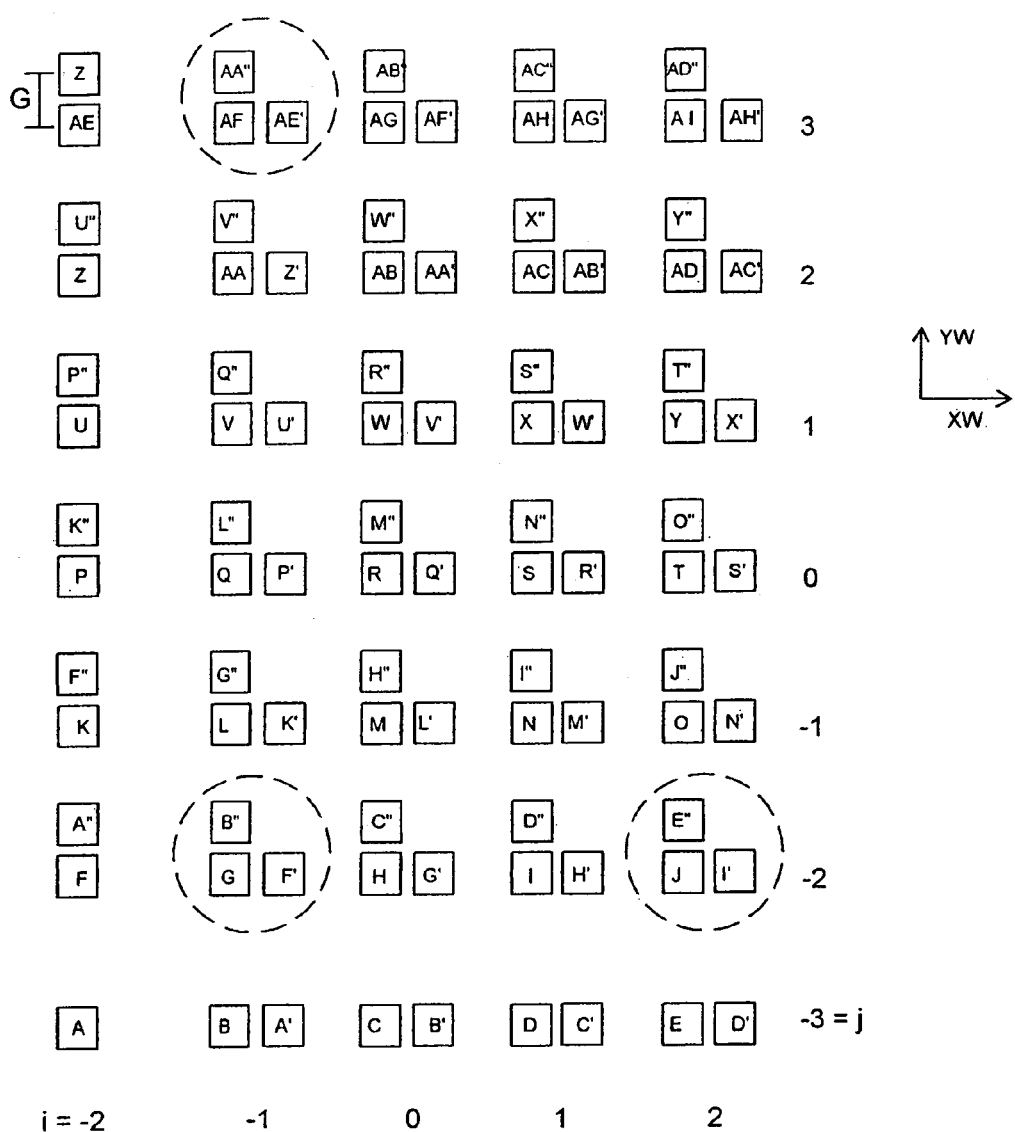
FIG. 12 shows a schematic field after a third exposure series.

For the third exposure the wafer is shifted $$(\Delta X, \Delta Y) = \left(0, -\frac{P}{M} - G\right)$$

from the first exposure position and the portion of the reticle indicated by 'third exposure' in FIG. 8 is projected onto the wafer creating focusing fiducials A": AD" that correspond one to one with the reticle focusing fiducials A: AD of FIG. 8. FIG. 12 shows a schematic of the projected field on the wafer after the third exposure.

Develop Wafer

The wafer is now (possibly) developed. In the case of technologies that utilize the latent image, this step may be omitted. See, for example, "Latent Image Metrology for Production Wafer Steppers", supra. Also, after development, the wafer may be etched and the photoresist stripped to improve the quality of the focusing fiducials.

Measure Focus Fiducials

At this point, the focusing fiducials are measured and the data is converted to an FPD value $\delta Z$. For example, if each FF was a box-in-box array exposed using a large pinhole aperture plate as described in U.S. Pat. Nos. 5,978,085 and 5,828,455, then after measuring each box-in-box array, we could determine the Zernike coefficient a4 and thereby infer the FPD:

$$\delta Z = \frac{dz}{da4} a4 \quad \text{(Equation 3)}$$

See, for example, "Gauging the Performance of an In-Situ Interferometer", M. Terry et al.)

The results of the focusing fiducial measurement are contained in the three arrays $\delta Z_{ij}$, $\delta X_{ij}$ and $\delta Y_{ij}$ where:

$\delta Z_{ij}$=FPD values from the focusing fiducials put down on the first exposure (A:AI in FIG. 12).

$$i=-mx:mx, j=-my:my \quad \text{(Equation 4)}$$

$\delta ZX_{ij}$=FPD values from the FFs laid down after the second exposure (single primed FF labels in FIG. 12).

$$i=-mx+1:mx, j=-my:my \quad \text{(Equation 5)}$$

$\delta ZY_{ij}$=FPD values from the FFs laid down after the third exposure (double primed FF labels in FIG. 12).

$$i=-mx:mx, j=-my+1:my \quad \text{(Equation 6)}$$

Reconstruct Lens Field Curvature

At this point we combine the measured FPD values ($\delta Z_{ij}$, $\delta ZX_{ij}$, $\delta ZY_{ij}$) to compute the SLFC. Defining:

$$ZL_{ij} = \text{SLFD at lens field position } (XF, YF) = \quad \text{(Equation 7)}$$
$$\frac{P}{M} * (i, j) i = -mx:mx, j = -my:my$$

$ZW_{ij}$=wafer height at index position (i,j) (FIG. 12) (Equation 8)

then using Equation 1 we have $$\delta Z_{ij} = ZL_{ij} + ZW_{ij} + a1 + b1*i + c1*j \quad \text{(Equation 9)}$$

$$i = -mx:mx$$

$$j = -my:my$$

$$\delta ZX_{ij} = ZL_{i-1,j} + ZW_{ij} + a2 + b2(i-1) + c2*j \quad \text{(Equation 10)}$$

$$i = -mx+1:mx \quad j = -my:my$$

$$\delta ZY_{ij} = ZL_{ij-1} + ZW_{ij} + a3 + b3*i + c3*(j-1) \quad \text{(Equation 11)}$$

$$i = -mx:mx \quad j = -my+1:my$$

where:
- a1, b1, c1 = stage induced z-shift, x-tilt, y-tilt for the first exposure;
- a2, b2, c2 = stage induced z-shift, x-tilt, y-tilt for the second exposure;
- a3, b3, c3 = stage induced z-shift, x-tilt, y-tilt for the third exposure.

The equation system represented by Equations 9, 10 and 11 can now be solved for $ZL_{ij}$, $ZW_{ij}$, a1, b1, c1, a2, b2, c2, a3, b3, c3 (singular value decomposition for example "Numerical Recipes, The Art of Scientific Computing", W. Press et al., *Cambridge University Press*, 52:64, 1990 and "Numerical Recipes, The Art of Scientific Computing", W. Press et al., *Cambridge University Press*, 509:520, 1990) but the result is not unique. However, the lens field curvature is uniquely determined for terms above quadratic. Put differently, ZL(x,y) is uniquely determined to within an additive factor of the form:

$$ZUL(x,y) = a + bx + cy + dx^2 + exy + fy^2 \quad \text{(Equation 12)}$$

where a, b, c, d, e, f are undetermined constants. In more detail, we solve Equations 9, 10 and 11 using the singular value decomposition and get a numerical solution $ZL*_{ij}$. Next we calculate coefficients a', b', c', d', e', f' by minimizing the quantity $$E = \sum_{i,j} [ZL^*_{ij} - (a' + b'*i + c'*j + d'i^2 + e'ij + f'j^2)]^2 \quad \text{(Equation 13)}$$

This is typically done via least squares minimization. The final result, which is ZL with terms of the type represented by ZUL removed, is $$ZL_{ij} = ZL^*_{ij} - (a' + b'^*i + c'^*j + d'^*i^2 + e'^*i^*j + f'^*j^2) \quad \text{(Equation 14)}$$

Figure 13:
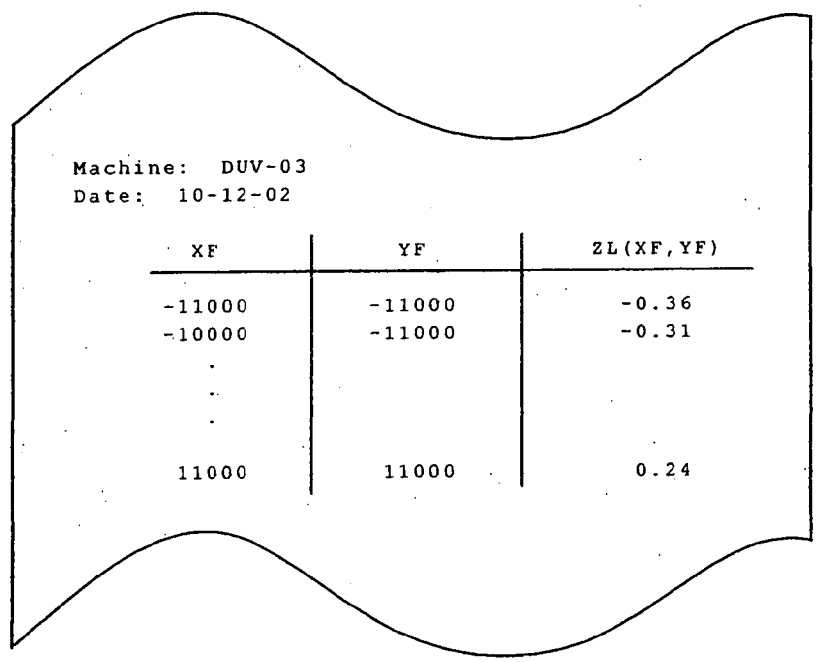
FIG. 13 shows one output of a method incorporating the techniques of the present invention, concerning static lens field curvature.
Figure 14:
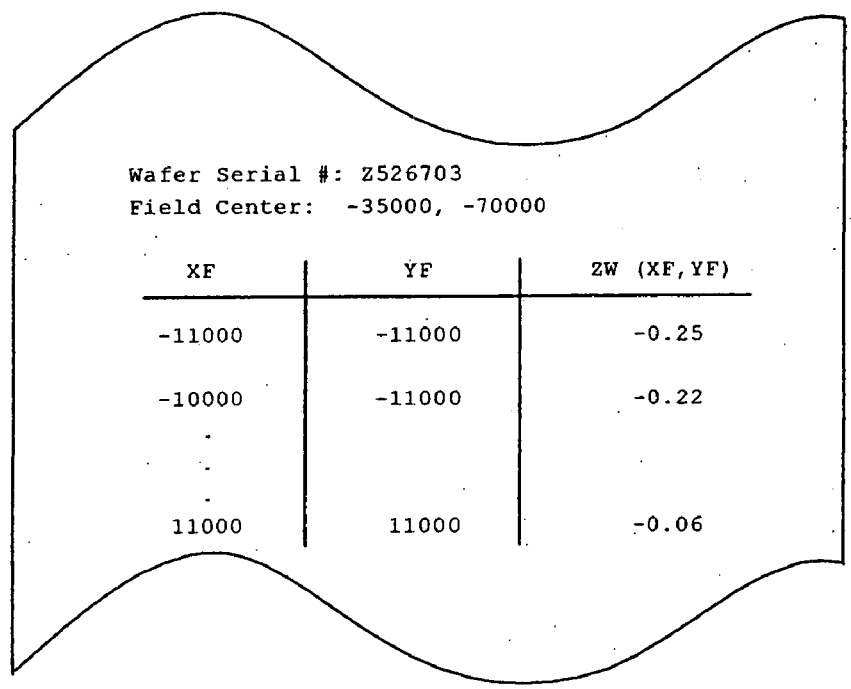
FIG. 14 shows another output in accordance with the present invention, concerning wafer flatness map over field.

This result in tabular form is shown in FIG. 13. FIG. 14 shows the wafer flatness variation over the same field. ZW(XF,YF) is also uniquely determined to within a quadratic function of the form of Equation 12. The unresolved or undetermined modes are removed in the same manner as for $ZL^*_{ij}$.

DISCUSSION OF SECOND MAIN EMBODIMENT

Figure 15:
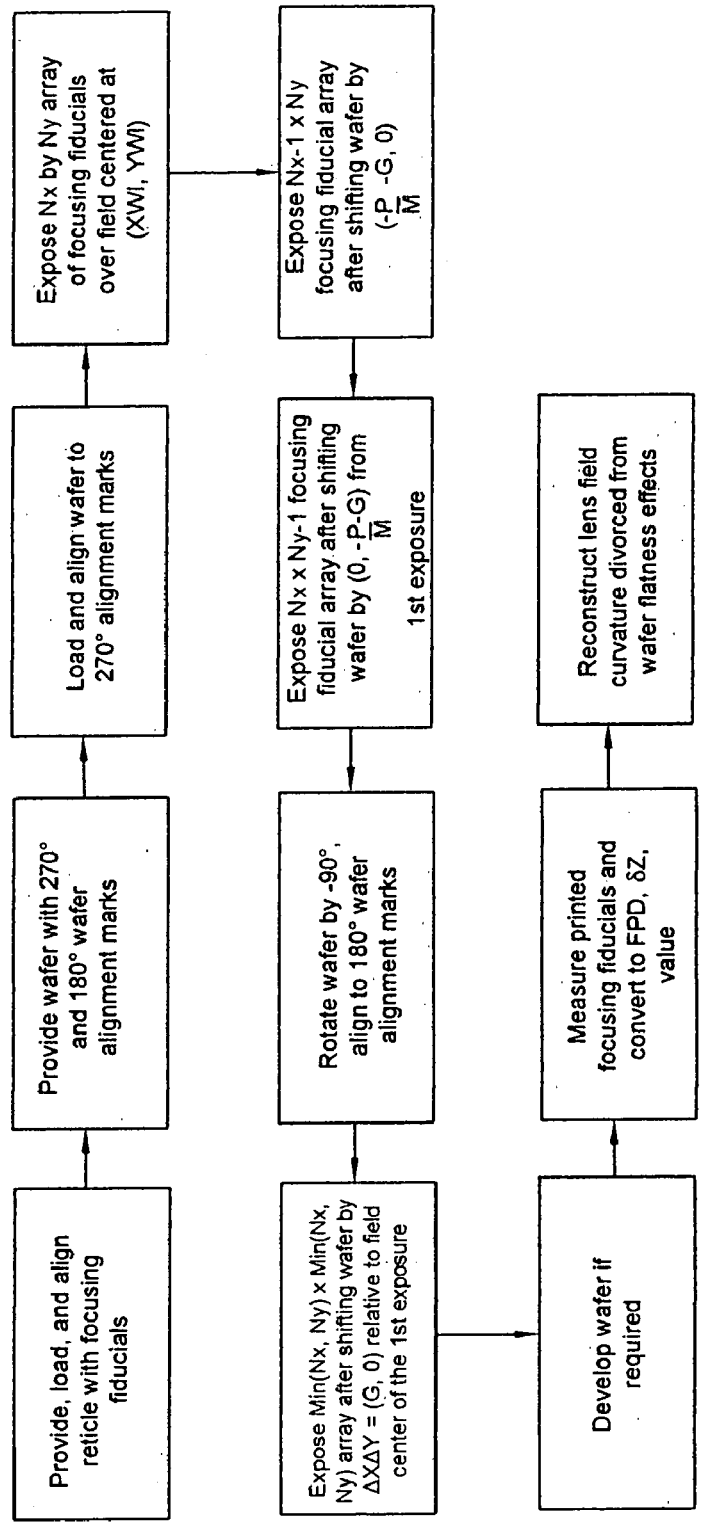
FIG. 15 shows process flow for an alternative embodiment having a different construction from FIG. 7.

A process flow diagram for the second embodiment is shown in FIG. 15.

Provide, Load and Align Reticle

Provide, load and align reticle is the same as in the first embodiment described above.

Provide Wafer

A wafer (FIG. 4) with 180° and 270° wafer alignment marks (WAM) provided. The wafer is then coated with photoresist.

Load and Align

Wafer is loaded and aligned to the WAMs at 270°.

First, Second, and Third Exposures

First, second, and third exposures are the same as in the first embodiment described above.

Rotate Wafer and Align

The wafer is now rotated −90° so the orientation of the wafer relative to the scanning direction will be as shown in FIG. 6, 'Notch angle=180°'.

Fourth Exposure

Figure 16:
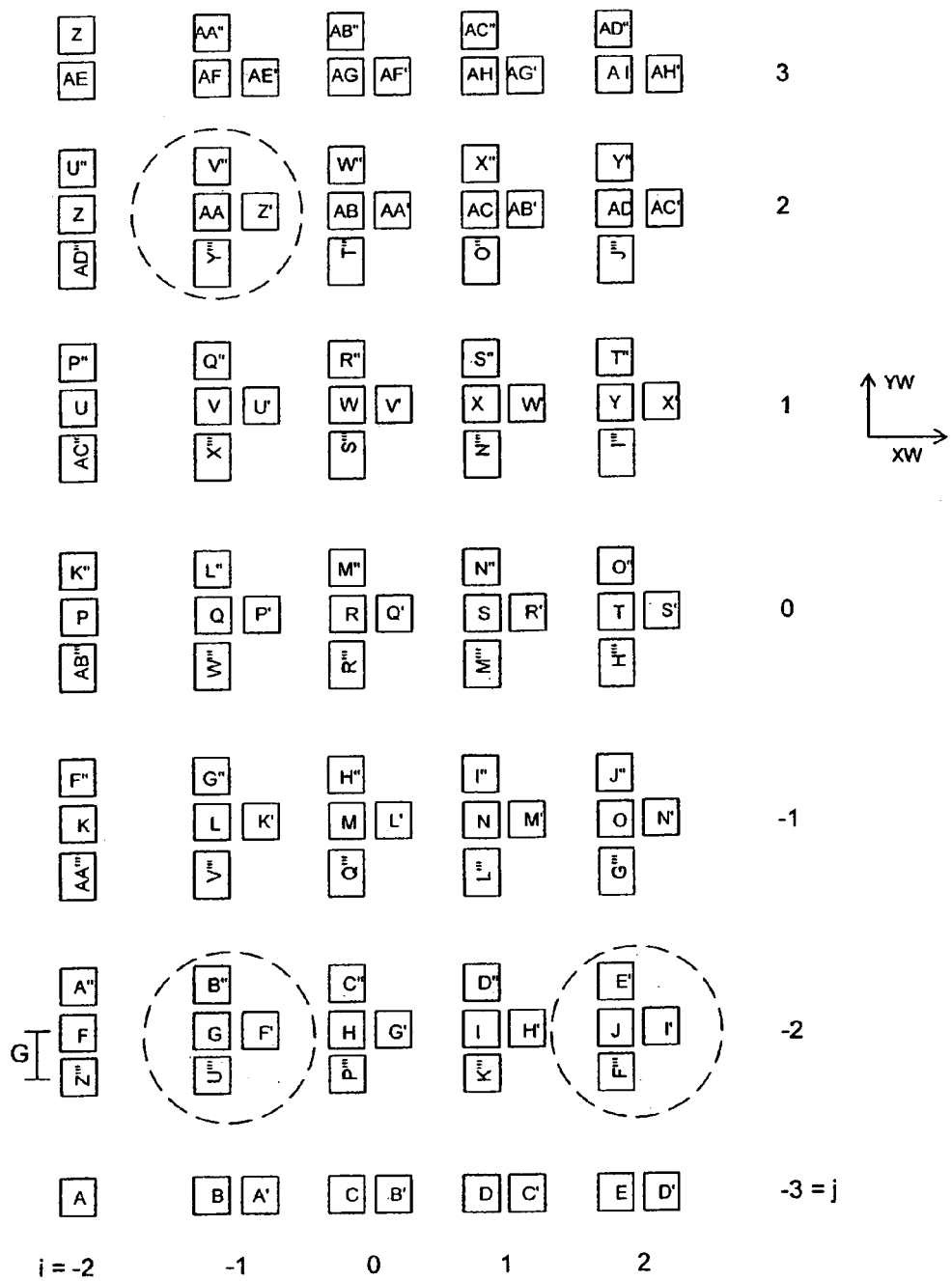
FIG. 16 shows a schematic field after a fourth exposure series.
Figure 17:
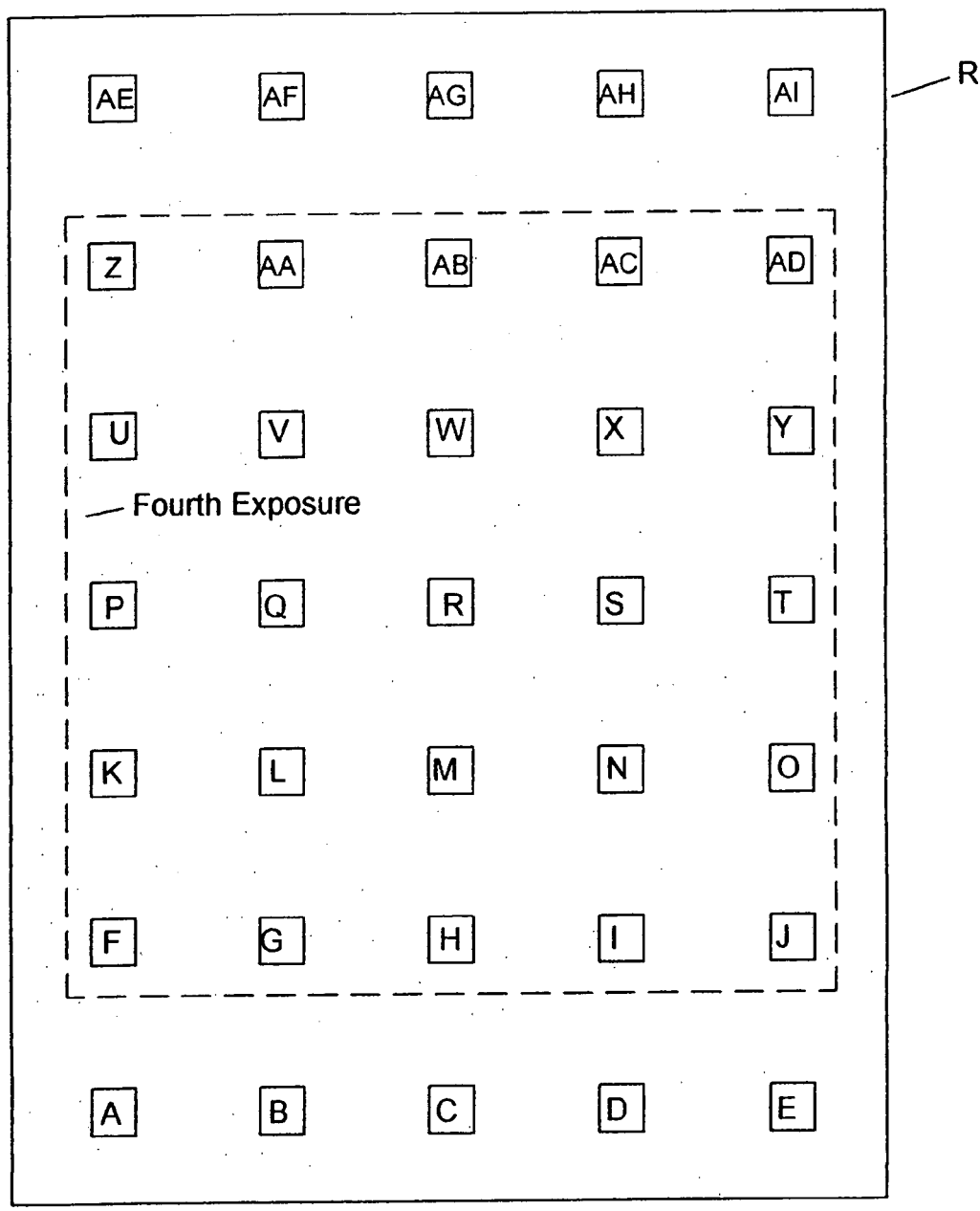
FIG. 17 shows a schematic FF reticle and portion used in the fourth exposure series.

After rotating and aligning the wafer it is shifted relative to its original field center by $(\Delta X, \Delta Y) = G, 0)$ and a Min(Nx,Ny)*Min(Nx,Ny) (FIG. 17 with Nx=5, Ny=7) array of focusing fiducials is exposed. Referring to FIG. 16 printed focusing fiducials F''':AD''' corresponding to reticle focusing fiducials F:AD on the reticle (FIG. 17) are shown separated by an offset G from one another.

Develop Wafer

Develop wafer is the same as in the first main embodiment.

Measure Focus Fiducials

Measure focus fiducials is the same as in first main embodiment only now there is an additional set of focusing $\delta Z90_{ij}$ where:

$Z90_{ij}$ = FPD values from the focusing fiducials put down on the fourth exposure (F''':AD''' in FIG. 16).

$$i = -\min(mx,my):\min(mx,my), j = -\min(mx,my):\min(mx,my) \quad \text{(Equation 15)}$$

Reconstruct Lens Field Curvature

At this point we combine the measured FPD values ($\delta Z_{ij}$, $\delta ZX_{ij}$, $\delta ZY_{ij}$, $\delta Z90_{ij}$) to sample the SLFC. The Equations 9, 10 and 11 from the first embodiment (vide supra) are the same. The only new equation sets come from $\delta Z90_{ij}$, which are:

$$\delta Z90_{ij} = ZL_{j,-i} + ZW_{ij} + a4 + b4*i + c4*j \quad \text{(Equation 16)}$$

$$i,j = -\min(mx,my):\min(mx,my)$$

where the only new quantities are:
- a4, b4, c4 = wafer stage induced z-shift, x-tilt and y-tilt for the fourth exposure.

The equation system represented by Equations 9, 10, 11, and 16 can now be solved for $ZL_{ij}$, $ZW_{ij}$ a1, b1, c1, a2, b2, c2, a3, b3, c3, a4, b4, c4 (singular value decomposition for example, "Numerical Recipes, The Art of Scientific Computing", W. Press et al., *Cambridge University Press*, 52:64, 1990 and "Numerical Recipes, The Art of Scientific Computing", W. Press et al., *Cambridge University Press*, 509:520, 1990) but the result is not unique. However the lens field curvature is uniquely determined for all terms above quadratic and two quadratic modes ($x^2 - y2$ and $x*y$). Put differently, ZL(x,y) is uniquely determined to within an additive function of the form:

$$ZUL(x,y) = a + b*x + c*y + d*(x^2 + y^2) \quad \text{(Equation 17)}$$

where a, b, c, d are undetermined constants. As discussed in the first embodiment we calculate constants a', b', c', d' that result from minimizing $$E = \sum_{i,j} (ZL_{ij}^* - (a' + b'*i + c'*j + d'*(i^2 + j^2)))^2 \quad \text{(Equation 18)}$$

where $ZL^*_{ij}$ is the as computed lens curvature and the uniquely determined portion of $ZL_{ij}$ is then $$ZL_{ij} = ZL^*_{ij} - (a' + b'^*i + c'^*j + d'^*(i^2+j^2)) \quad \text{(Equation 19)}$$

This result in tabular form is shown in FIG. 13. The wafer flatness ZW(x,y) is again uniquely determined to within a function of the form of Equation 16 and its unique part similarly computed as $Zl_{ij}$. FIG. 14 shows an example of the final wafer flatness.

THIRD MAIN EMBODIMENT

Figure 18:
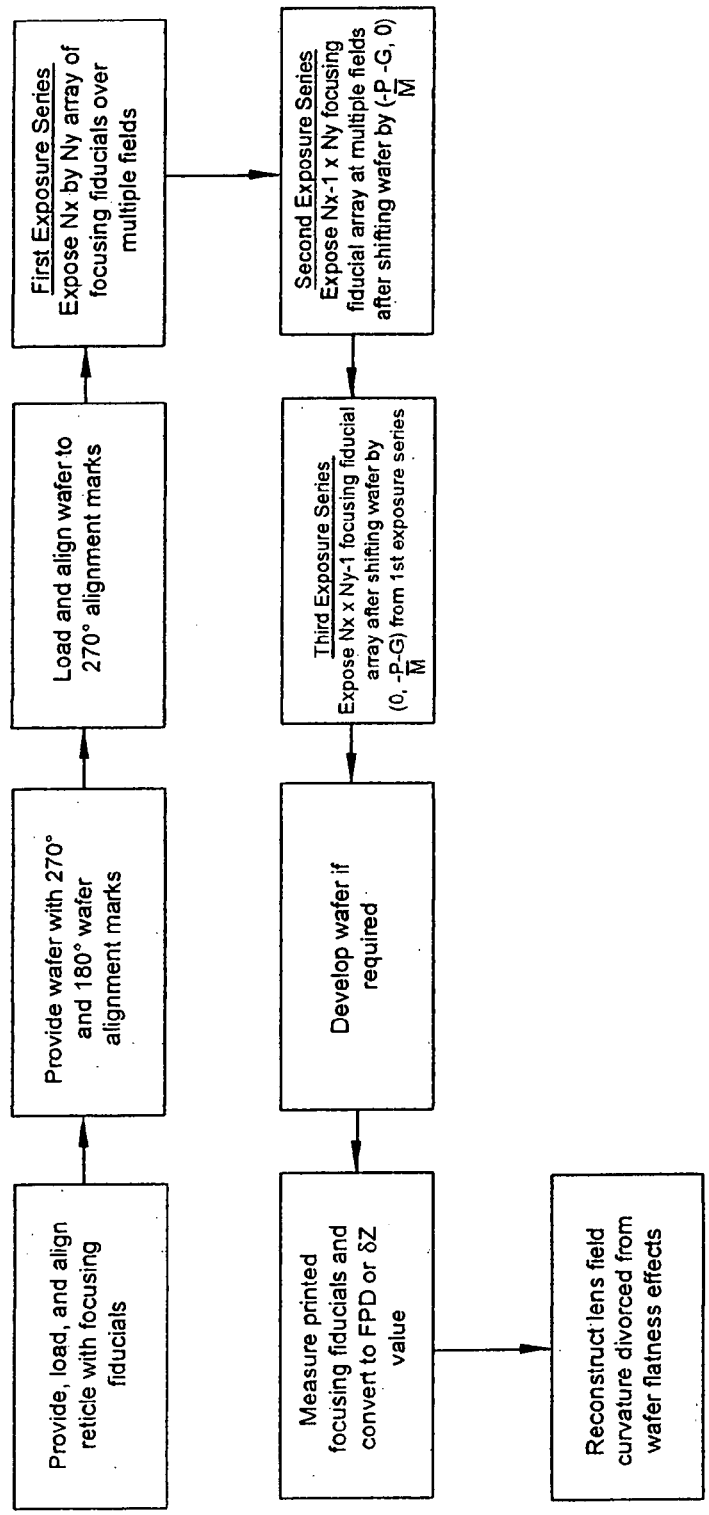
FIG. 18 shows process flow for a third alternative embodiment different from FIG. 7 and FIG. 15.

The process steps for the third main embodiment of this invention are shown in FIG. 18. This embodiment allows us to determine SLFC to within a piston, x-tilt and y-tilt value. The first three steps, "provide reticle", "provide wafer", and "load wafer" are identical to those in the first embodiment.

First Exposure Series

Figure 10:
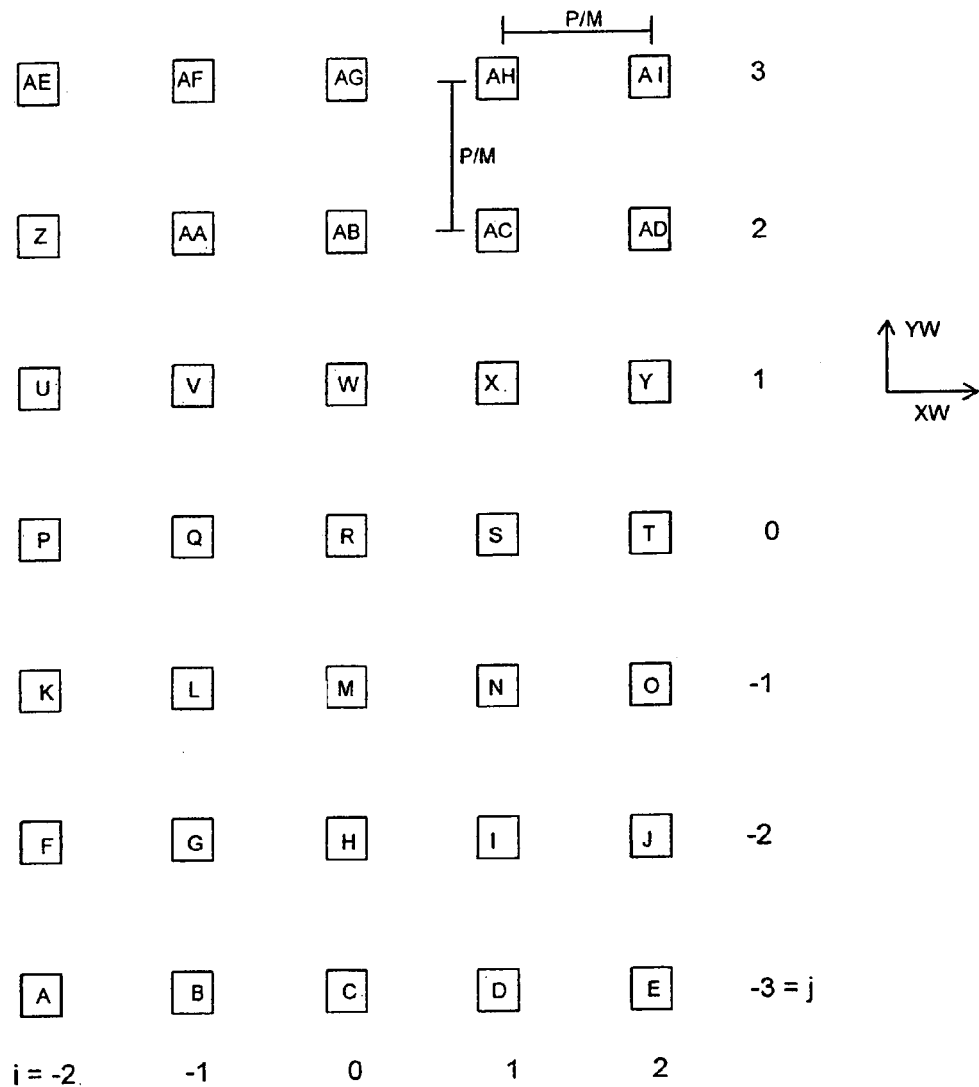
FIG. 10 shows a schematic field after a first exposure series.
Figure 19:
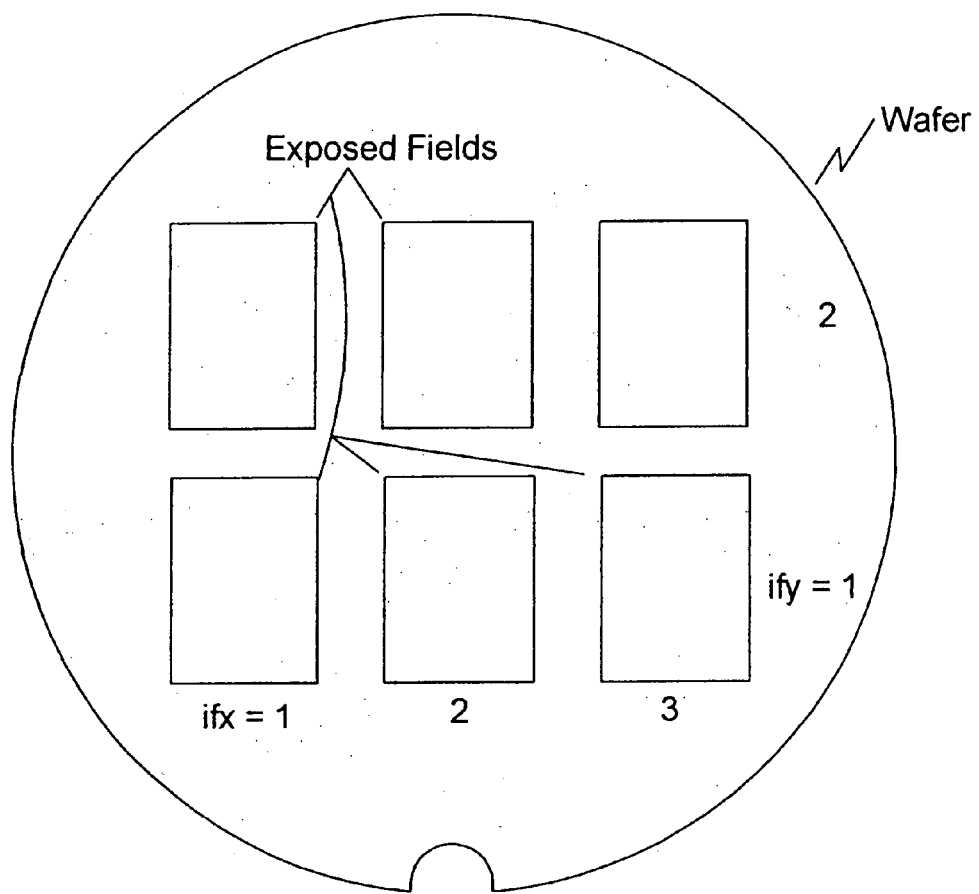
FIG. 19 shows multiple exposed fields on a wafer.

Reticle R of FIG. 8 is statically exposed at a multiplicity of fields (FIG. 19), the exposure within each field following the same procedure as in the first embodiment and looking schematically like FIG. 10. In FIG. 19 we show Nf=6 fields exposed with each field labeled by its indexed position IFX, IFY.

Second Exposure Series

The wafer is now statically exposed as in the first main embodiment (wafer shifted $$(\Delta X, \Delta Y) = \left(-\frac{P}{M} - G, 0\right)$$

from first exposure series) only now at the same Nf fields in the first exposure series (FIG. 19). FIG. 11 is a detailed schematic view of each field after the second exposure series.

Third Exposure Series

The wafer is statically exposed as in the first main embodiment (wafer shifted ($\Delta X$, $$(\Delta X, \Delta Y) = \left(0, -\frac{P}{M} - G\right)$$

from first exposure series) only now at some Nf fields as in the first exposure series (FIG. 19). FIG. 12 is a schematic of each field after the third exposure series.

Develop Wafer

The wafer is now (possibly) developed. In the case of technologies (See, for example, "Latent Image Metrology for Production Wafer Steppers", supra) that utilize the latent image, this step may be omitted. Also, after development, the wafer may be etched and the photoresist stripped to improve the quality of the focusing fiducials.

Measure Focusing Fiducials

Focusing Fiducials are measured and reduced to FPD values (see the discussion above). The difference now is that δZ, δZX, δZY of Equations 4, 5 and 6 now also depend on the field (ifx, ify) so we get:

$\delta Z_{ij}(ifx,ify)$=FPD values from the focusing fiducials put down in the first exposure sequence at field ifx, ify and site i,j. (Equation 20)

$\delta ZX_{ij}$(ifx,ify) and $\delta ZY_{ij}$(ifx,ify) are the FPD values from the second and third exposure sets, respectively.

Reconstruct Lens Field Curvature

At this point, measured FPD values δZij (ifx,ify), δZXij (ifx,ify) and δZYij (ifx,ify) are combined to reconstruct the static lens field curvature. The generalizations of Equations 9, 10 and 11 are:

$$\delta Z_{ij}(ifx,ify) = ZL_{ij} + ZW_{ij}(ifx,ify) + a1(ifx,ify) + b1(ifx,ify)\\ *i + c1(ifx,ify)*j \quad \text{(Equation 21)}$$

i=−mx:mx, j=−my:my, ifx,ify range over exposed fields $$\delta ZX_{ij}(ifx,ify) = ZL_{i-1\,j} + ZW_{ij}(ifx,ify) + a2(ifx,ify) + b2(ifx,\\ ify)*(i-1) + c2(ifx,ify)*j \quad \text{(Equation 22)}$$

i=−mx+1mx, j=−my:my, ifx,ify range over exposed fields $$\delta ZY_{ij}(ifx,ify) = ZL_{i\,1-j} + ZW_{ij}(ifx,ify) + a3(ifx,ify) + b3(ifx,\\ ify)*i + c3(ifx,ify)*(j-1) \quad \text{(Equation 23)}$$

i=−mx:mx, j=−my+1:my, ifx,ify range over exposed fields where:

$ZW_{ij}(ifx,ify)$=wafer height at index position (i,j) (FIG. 12) in field (ifx,ify). The wafer height will vary on a field by field basis.

a1(ifx,ify), b1(ifx,ify), c1(ifx,ify)=stage induced z-shift, x-tilt, y-tilt for the first exposure series at field (ifx,ify).

a2(ifx,ify), b2(ifx,ify), c2(ifx,ify), a3(ifx,ify), b3(ifx,ify), c3(ifx,ify)=similar to a1, b1, c1 but for exposure series two and three.

Equation set 21, 22, and 23 are now solved for $ZL_{ij}$, $ZW_{ij}$(ifx,ify), a1(ifx,ify), b1(ifx,ify), c1(ifx,ify), a2(ifx,ify), b2(ifx,ify), c2(ifx,ify), a3(ifx,ify), b3(ifx,ify), c3(ifx,ify) (singular value decomposition, for example "Numerical Recipes, The Art of Scientific Computing", W. Press et al., *Cambridge University Press,* 52:64, 1990 and "Numerical Recipes, The Art of Scientific Computing", W. Press et al., *Cambridge University Press,* 509:520, 1990) but the result is not unique. In a strictly deterministic sense there is still an ambiguity in ZL(x,y) for terms lower than third degree (Equation 12 is the ambiguity). However, it can be shown that the quadratic terms represented by coefficients d, e, and f in Equation 12 are determinable with an error dependant on the wafer stage x-tilt and y-tilt. So if we decompose b1(ifx, ify) into repeatable and non-repeatable parts as:

$$b1(ifx,ify) = bstg + \delta b1(fix,ify) \quad \text{(Equation 24)}$$

where:

bstg=repeatable part of stage x-tilt

δb1(ifx,ify)=non repeatable part of stage x-tilt.

In an operational sense, if we know b1(ifx,ify) at a large number of fields, the repeatable part is approximately $$b_{stg} \approx \frac{1}{Nf} \sum_{ifx,ify} b1(ifx, ify) \quad \text{(Equation 25)}$$

and the non-repeatable part:

$$\delta b1(ifx,ify) = b1(ifx,ify) - b_{stg} \quad \text{(Equation 26)}$$

Then the statistics of δb1(ifx,ify) will determine the error in the quadratic terms d,e,f principally through the standard deviation.

$$\sigma_b^2 = \langle \delta b1^2(ifx,ify) \rangle \quad \text{(Equation 27)}$$

where < >denotes averaging over many fields or realizations of the wafer stage tilt. It should be noted that b2(ifx,ify) and b3(ifx,ify) will have the same repeatable part, bstg as b1 and δb2, δb3 will be similarly defined and have the same statistics as b1. A similar discussion follows for c1(ifx,ify), c2(ifx,ify) and c3(ifx,ify) with the result that the error in the desired quadratic terms in ZL will depend on:

$$\sigma_c^2 = \langle \delta c1(ifx, ify)^2 \rangle \quad \text{(Equation 28)}$$

The error (expressed as a standard deviation) therefore in the coefficients d,e,f of Equation 12 will be in order of magnitude:

$$\sigma_{er} \sim \frac{\sqrt{\sigma_b^2 + \sigma_c^2}}{\sqrt{N_f}} \left(\frac{M}{P}\right)^2 \quad \text{(Equation 29)}$$

where P/M is the FF principal grid spacing (FIG. 10), and Nf is the number of exposure fields measured.

So, the operations for determining $ZL_{ij}$ consist first of solving Equation sets 21, 22 and 23 for $ZL_{ij}$, $ZW_{ij}$(ifx,ify), etc. Now we remove terms through quadratic from $ZL^*_{ij}$ (the numerically computed solution) as in Equation 13. We then find the best fit of the form $\alpha 1 + \beta 1^* i + \gamma 1^* j$ to:

$$\frac{1}{Nf} \sum_{ifx,ify} \delta ZX_{ij}(ifx, ify) - \delta Z_{ij}(ifx, ify) - ZL^*_{i-1,j} + ZL^*_{ij} \quad \text{(Equation 30)}$$

and also the best fit of the form: $\alpha 2 + \beta 2^* i + \gamma 2^* j$ to:

$$\frac{1}{NF} \sum_{ifx,ify} \delta ZY_{ij}(ifx, ify) - \delta Z_{ij}(ifx, ify) - ZL^*_{ij-1} + ZL^*_{ij} \quad \text{(Equation 31)}$$

and we can then compute the quadratic parts of $ZL_{ij}$:

$$d' = \frac{1}{2}[\langle b2 \rangle - \langle b1 \rangle - \beta 1] \quad \text{(Equation 32)}$$

$$e' = \frac{1}{2}[\langle c2 \rangle - \langle c1 \rangle + \langle b3 \rangle - \langle b1 \rangle - \gamma 1 - \beta 2] \quad \text{(Equation 33)}$$

$$f' = \frac{1}{2}[\langle c3 \rangle - \langle c1 \rangle - \gamma 2] \quad \text{(Equation 34)}$$

where < >denotes averaging over fields.

So we get for our final answer for $ZL_{ij}$ of $$ZL_{ij} = ZL^*_{ij} + d' \cdot i^2 + e' \cdot i \cdot j + f' \cdot j^2 \quad \text{(Equation 35)}$$

(FIG. 13) that includes the quadratic terms but does not include piston, x-tilt, or y-tilt.

Knowing ZL(x,y) to within a term a+b*x+c*y is substantially the same as completely knowing ZL(x,y) since the repeatable part of the wafer stage tilt is of the same form, ar+br*x+cr*y. The combined FPD of the stage and the undetermined portion of ZL is therefore of the form:

$$FPD_{PTT}(x,y) = (ar+a) + (br+b) \cdot x + (cr+c) \cdot y \quad \text{(Equation 36)}$$

Since we can completely correct for the piston (a), x-tilt (b), and y-tilt (c) modes in ZL(x,y) through wafer stage adjustment (e.g. ar=−a, br=−b, cr=−c) these lens modes can and should be lowered in with wafer stage mode corrections. Therefore representations of ZL(x,y) divorced from piston, x-tilt, and y-tilt are essentially complete.

Figure 20:
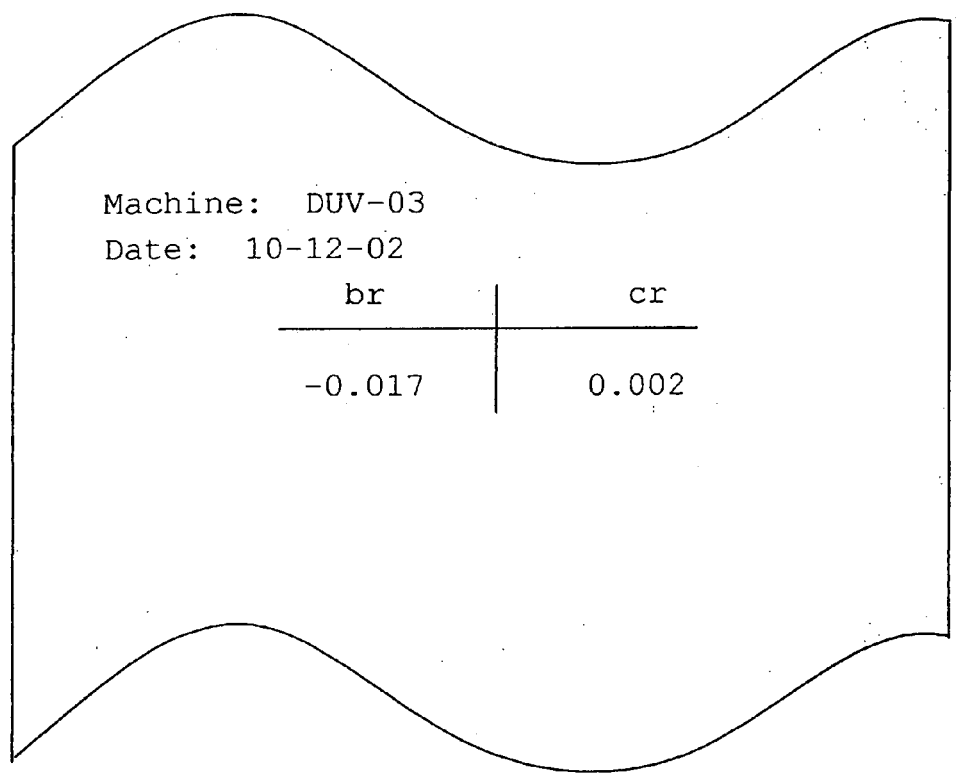
FIG. 20 shows yet another output in accordance with the present invention, concerning a repeatable part of stage tilt.

Now further analysis of Equations 21, 22, and 23 allows us to extract the repeatable parts of the wafer stage x and y tilts (br and cr). They are shown in FIG. 20. Furthermore, we also get wafer flatness to within a piston, x-tilt, and y-tilt at each field ifx, ify.

FOURTH MAIN EMBODIMENT

Figure 21:
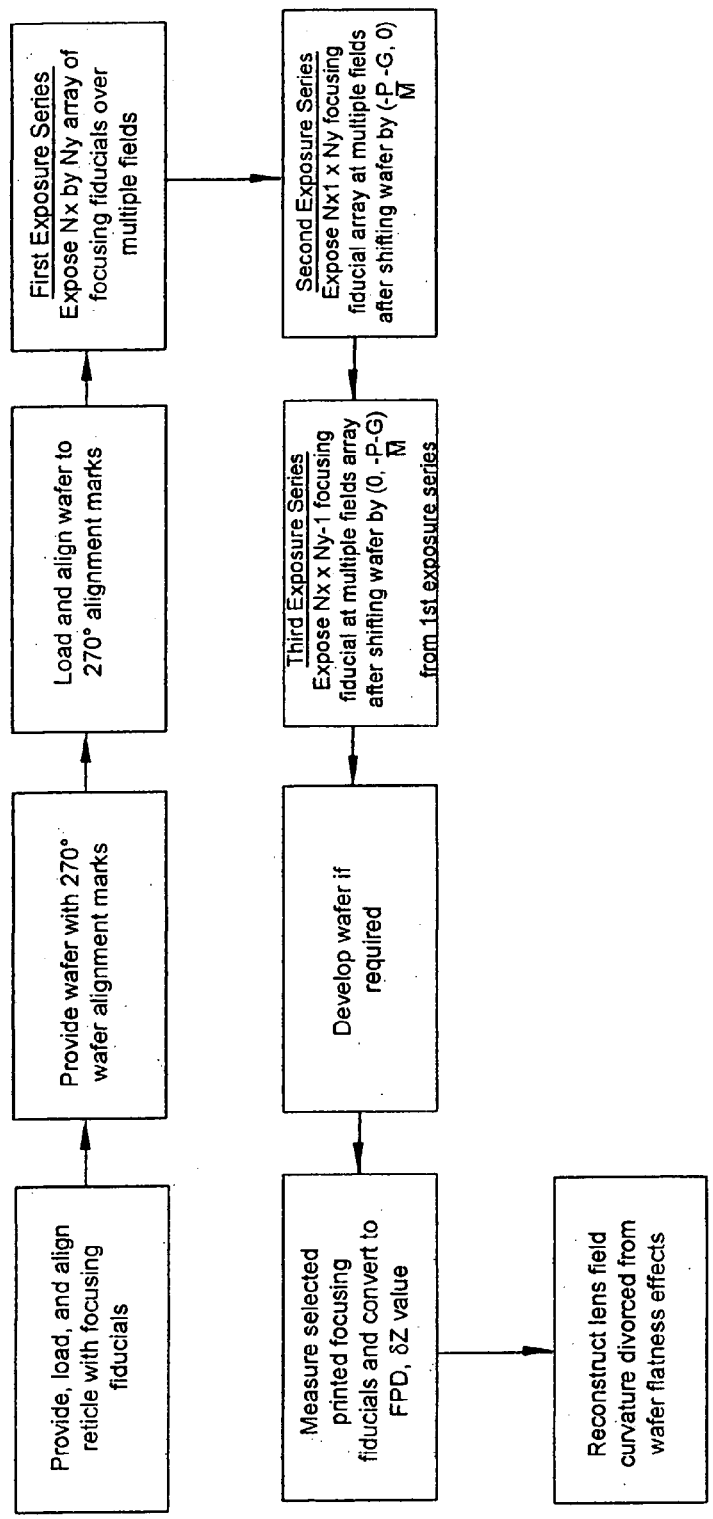
FIG. 21 shows process flow for an alternative (fourth) embodiment.
Figure 22:
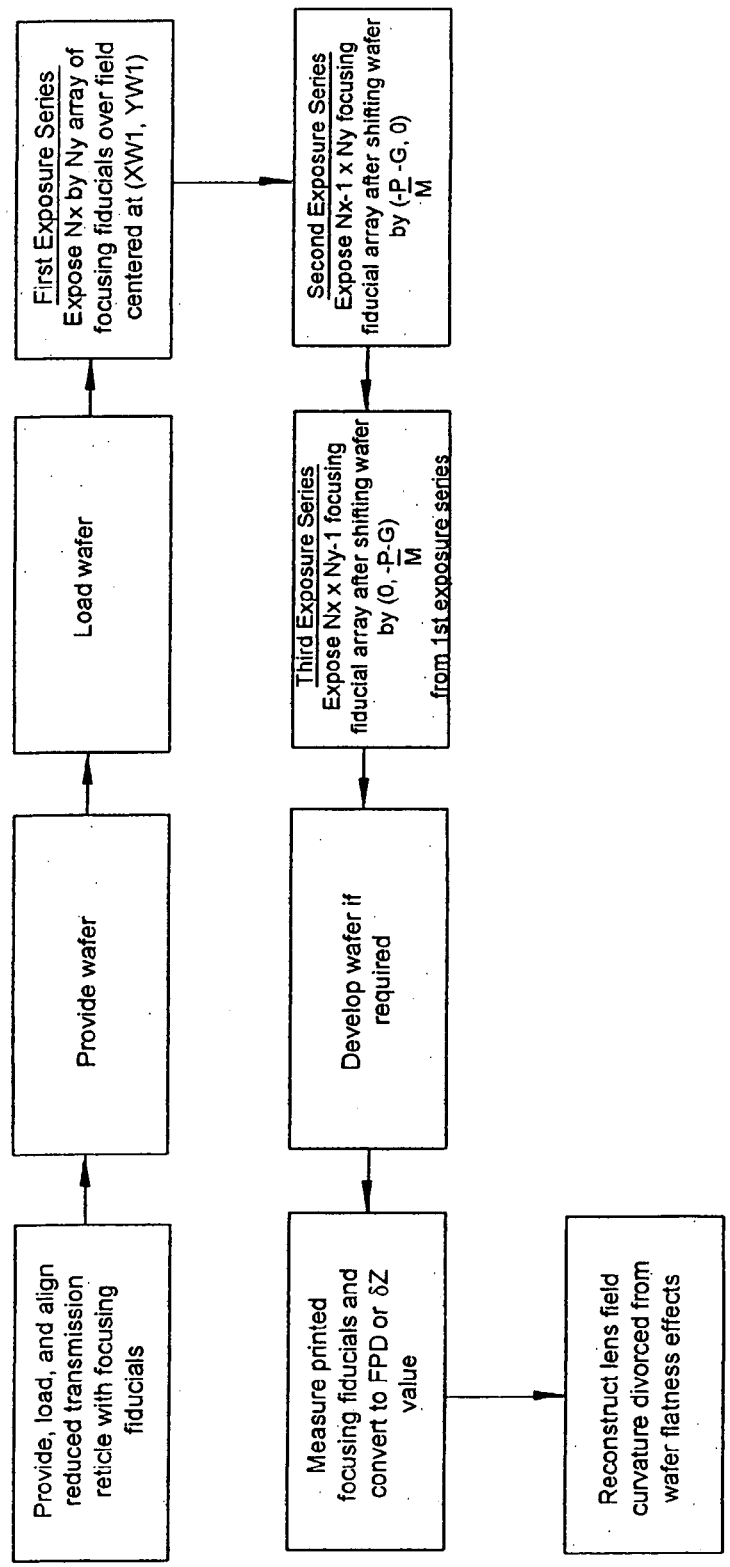
FIG. 22 shows process flow for yet another alternative embodiment.

The process steps for the fourth embodiment are shown in FIG. 21. It is similar to the third embodiment but requires fewer FPD measurements. ZL is determined to within a piston, x-tilt, and y-tilt.

The first seven steps ("Provide Reticle" through "Develop Wafer") are word for word identical with the third main embodiment described above.

Measure Focusing Fiducials

At this point, focusing fiducials fields with three overlapped exposures (e.g. FIG. 12) are arranged at a number, Nf, of distinct fields (Nf=6 in FIG. 19). We now choose one field (say ifx=ify=1 for definiteness) and measure all relevant focusing fiducials in it and reduce them to FPD values. At all of the other fields we measure and reduce to FPD values a minimum of three complete, non-collinear sites. These sites are preferably spaced as far as possible from one another in the X and Y directions (located at corners within the exposed field). Referring to FIG. 12, three suitable sites at (i, j)=(2, −2), (−1, −2), (−1, 3) are circled by dashed lines. Each of the sites is complete in that each contains FFs from each exposure series. Site (i,j)=(−2, −2) is an example of an incomplete site, it contains FFs only from the first and third exposure series.

So at the end of the measurement and data reduction process we will have the following FPD values:

$\delta Z_{ij}(ifx,ify)$=FPD values from first exposure series at field (ifx,ify) i=−mx:mx j=−my:my for (ifx, ify)= (1,1) (i, j)=(i1, j1), (i2, j2), (i3, j3) at other fields (Eq. 37)

$\delta Z_{ij}(ifx,ify)$=FPD values from second exposure series at field (ifx, ify) i=−mx+1:mx j=my:my for (ifx, ify)=(1,1) (i, j)=(i 1, j 1), (i2, j2), (i3, j3) at other fields (Eq. 38)

$\delta Z_{ij}(ifx,ify)$=FPD values from third exposure series at field (ifx, ify) i=−mx:mx j=my+1:my for (ifx, ify)=(1,1) (i, j)=(i1, j1), (i2, j2), (i3, j3) at other fields (Eq. 39)

Here, (i1, j1), (i2, j2), (i3, j3) are indices of the non-collinear triplet at the sparsely measured fields.

Reconstruct Lens Field Curvature

At this point measured FPD values described in Equations 37, 38, 39 are combined to reconstruct the static lens field curvature. FPD values from the completely measured field ($\delta Z_{ij}(1,1)$, $\delta ZX_{ij}(1,1)$, $\delta Zy_{ij}(1,1)$) are reconstructed using the procedures outlined in the first main embodiment to arrive at the lens distortion $ZL_{ij}$ to within terms above quadratic (Equation 14). Relabeling $ZL_{ij}$ as ZL*ij, we next form the quantities specified in Equations 30 and 31 but only at the (i;

j) where we have done a sparse measurement (e.g., (i, j)=(i1, j1), (i2, j2), (i3, j3) and again fit the results to functions $\alpha 1 + \beta 1 * i + \gamma 1 * j$ fit for Equation 30

$\alpha 2 + \beta 2 * i + \gamma 2 * j$ fit for Equation 31 the quadratic parts of $ZL_{ij}$ have coefficients d', e', f' given by:

$$d' = -\beta 1/2 \qquad \text{(Equation 40)}$$

$$e' = -(\gamma 1 + \beta 2)/2 \qquad \text{(Equation 41)}$$

$$f' = -\gamma 2/2 \qquad \text{(Equation 42)}$$

so we get for our final answer for $ZL_{ij}$:

$$ZL_{ij} = ZL^*_{ij} + d' \cdot i^2 + e' \cdot ij + f' \cdot j^2 \qquad \text{(Equation 43)}$$

(FIG. 17) that includes quadratic terms but does not include piston, x-tilt, or y-tilt.

FIFTH MAIN EMBODIMENT

This embodiment allows for reconstruction of the lens field curvature including quadratic terms.

Provide, Load and Align Reduced Transmission Reticle

A reduced transmission focusing fiducial reticle is provided. Reduced transmission focusing fiducial reticle is designed to produce a reduced transmission over that of a standard reticle. This reduced transmission has the effect of allowing for more exposures at a given field, which in turn allows multiple sub E0 exposures on a given field will average out the wafer stage repeatability in x-tilt and y-tilt allowing us to reliably determine the quadratic portion of the lens field curvature as well as the repeatable part of the wafer stage tilt.

Focusing fiducial reticle R of FIG. 8 will typically, but with some important exceptions (vide infra), be designed to operate at doses $E_{tot} = G \, E \, 0$, where G is in the range $\approx < 2$ to 5. Now to the extent we are limited by the projection lithography tool in producing single static exposures that deliver small $$\left( \approx < \frac{E0}{100} - \frac{E0}{10} \right)$$

doses, we can modify focusing fiducial reticle R to either reflect, attenuate, or otherwise diminish the amount of light passing through it. If T is the reduction factor, e.g., normalized intensity=1 passes through R before modification but normalized intensity=T<1 passes through R after modification, then if $Ne^{max}$ is the maximum number of exposures we can utilize for a single exposure sequence before modification, $Ne^{max}/T$ (which is $>Ne^{max}$) will be the maximum number of static exposures we can utilize for an exposure for the reduced transmission reticle. The positive effect of this reduced transmission reticle is to practically increase the effective number of fields Nf of Equation 29. For example, if E 0=3 mj/cm² and $E_{min}$=minimum dose deliverable by machine for a single exposure=0.5 mj/cm² then our delivered dose per exposure is $E = E_{min}$ and $N_e = 3/0.5 = 6$. Now if the reticle transmission is T=6% then the maximum number of exposures we can deliver is:

$$N_e = \frac{E0}{TE_{min}} = \frac{3}{0.06 * 0.5} = 100 \qquad \text{(Equation 44)}$$

Figure 23:
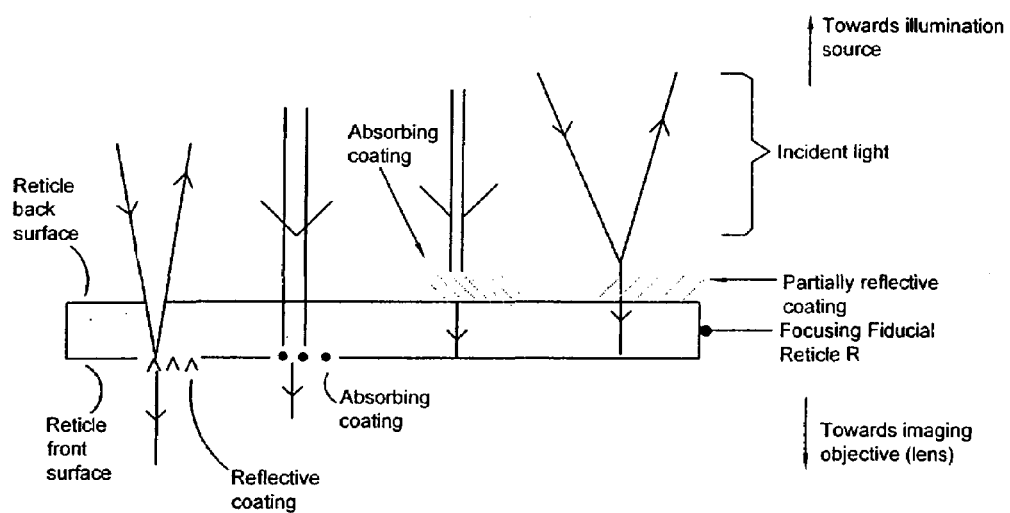
FIG. 23 shows exemplary mechanisms for creating a reduced transmission in reticle.
Figure 24:
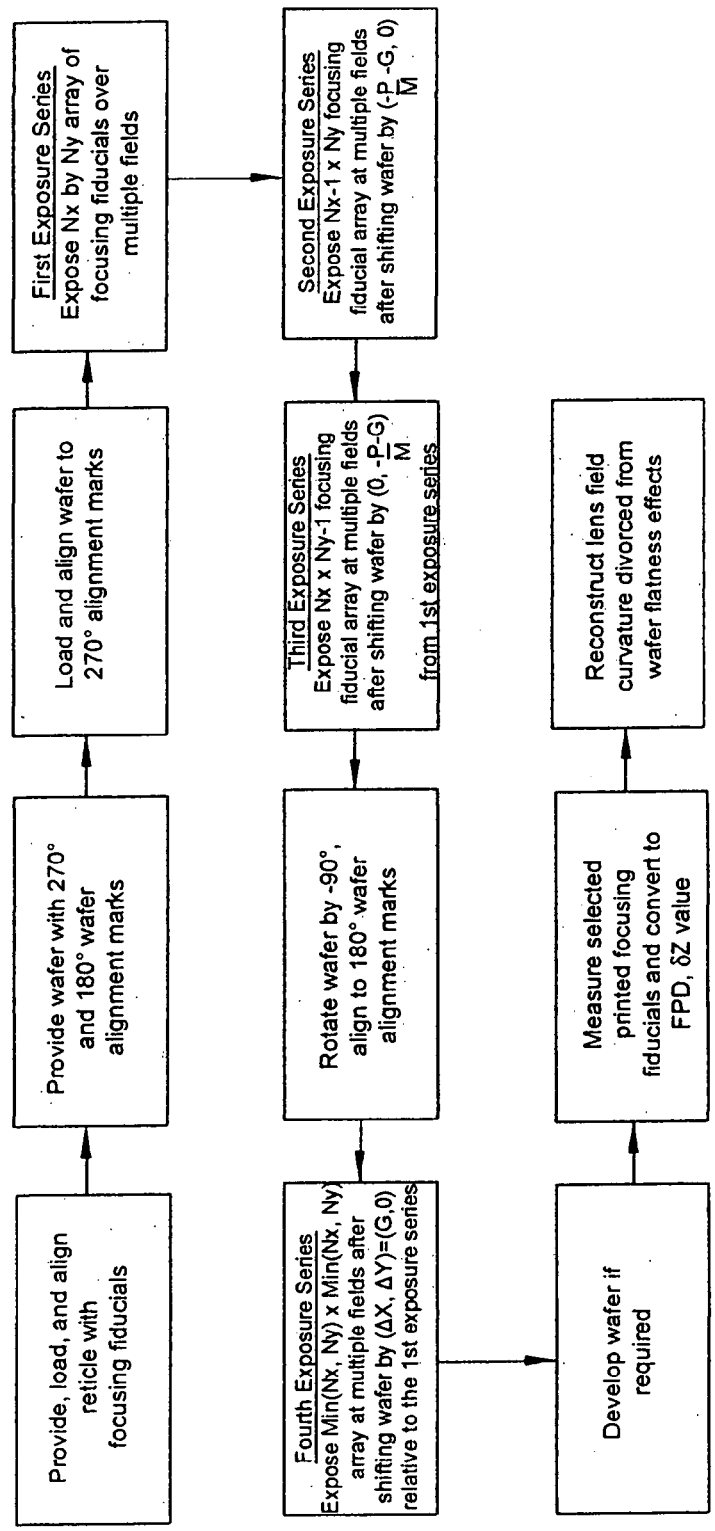
FIG. 24 shows process flow for another alternative embodiment.

This leads to an error reduction equivalent to discretely exposing Nf=Ne=100 fields. This has tremendous advantage in terms of reduction of metrology tool time in measuring focusing fiducials. Having discussed the operation and advantage of a reduced transmission reticle, we now discuss its construction. One construction (see FIG. 23), is by placing a partially reflecting coating on the reticle backside. This is typically a multiple layer dielectric coating and through its detailed design we can easily achieve transmission T in the 1% to 10% range and larger if necessary. This coating can be applied either before or after the standard reticle has been produced.

The partially reflecting coating could also be applied to the reticle front side. Another mechanism (FIG. 23) is an absorbing coating placed on the reticle back side. This coating could consist of dielectric materials that absorb at the tool illumination wavelength or a thin metallic layer. Yet another mechanism utilizes absorbing materials placed on the mask front side. The most practical version of front side absorbing mechanisms would include a mask with active area having chrome and attenuated phase shift mask material. See, for example, "The Attenuated Phase Shift Mask", supra. Then the normally open areas of the mask would be replaced with attenuated phase shift regions that typically have a transmission T≈6% or 0.06.

All of the above discussion applies to FF reticles of the ISI type. See, for example, U.S. Pat. No. 5,978,085 supra. However, in this case because of the pinhole in the aperture plate, these reticles already operate in a reduced transmission mode with T≈1%; additional reduced transmission coatings are typically unnecessary.

The steps of loading and aligning the reticle are the same as in the first main embodiment.

Provide Wafer, Load Wafer

Provide wafer, load wafer are the same as in the first main embodiment.

First Exposure Series

The exposure setup is identical to the first main embodiment, only we now carry out multiple (Ne) sub-E0 exposures to create the printed focusing fiducials (A:AI of FIG. 10) at a single field.

Second Exposure Series

Second exposure series is identical to first main embodiment, only now Ne sub-E0 exposures are required to create the printed FFs in a single field (primed (')FFs in FIG. 11).

Third Exposure Series

Third exposure series is identical to the first embodiment described above, except that now (Ne) sub-E0 exposures are required to create the printed FFs in a single field (double primed (") FFs in FIG. 12). A this point, a single field of printed FFs as in FIG. 12 has been created from three exposure sequences. Each exposure sequence consists of multiple sub-E0 exposures.

Develop Wafer

Develop wafer is the same as in the first embodiment described above.

Measure Focusing Fiducials

Measure focusing fiducials is the same as in the first embodiment described above.

Reconstruct Lens Field Curvature

At this point, we can combine the measured FPD values ($\delta Z_{ij}$, $\delta ZX_{ij}$, $\delta ZY_{ij}$) to compute the SLFC. Defining $$ZL_{ij} = SLFD \text{ at lens field position } (XF, YF) \quad \text{(Equation 45)}$$
$$= \frac{P}{M} * (i, j)$$
$$i = -mx:mx, \ j = -my:my$$

$ZW_{ij}$=wafer height at index position (i, j) (FIG. 12) (Equation 46)

then using Equation 1 we have:

$$\delta Z_{ij} = ZL_{i-1 j} + ZW_{ij} + a + b^*i + c^*j \quad \text{(Equation 47)}$$

$i=-mx:mx$ $j=-my:my$ $$\delta ZX_{ij} = ZL_{i-1 j} + ZW_{ij} + a + b(i-1) + c^*j \quad \text{(Equation 48)}$$

$i=-mx+1:mx \ j=-my:my$ $$\delta ZY_{ij} = ZL_{i j-1} + ZW_{ij} + a + b^*i + c^*(j-1) \quad \text{(Equation 49)}$$

$i=-mx:mx \ j=-my+1:my$ where
- a, b, c=repeatable part of the wafer stage induced z-shift, x-tilt, and y-tilt. They are the same in all three exposure series.

The equation system represented by Equations 47, 48, and 49 can now be solved as in the first main embodiment. The result uniquely determines $ZL_{ij}$ up to terms of the form a'+b'i+c'j, which is substantially all of $ZL_{ij}$. To get the final answer, we take the numerical solution of Equations 47, 48, 49 as determined by appropriate means, $ZL^*_{ij}$, and minimize the quantity $$E = \sum_{i,j} [ZL^*_{ij} - (a' + b'^*i + c'^*j)]^2 \quad \text{(Equation 50)}$$

to determine a', b', c' and then report the final lens field curvature in FIG. 13 as:

$$ZL_{ij} = ZL^*_{ij} - (a' + b'i + c'j) \quad \text{(Equation 51)}$$

wafer flatness $ZW_{ij}$ through quadratic terms is also determined and reported (FIG. 14) as well as the repeatable portion of stage x and y tilt (br, cr of FIG. 20).

SIXTH MAIN EMBODIMENT

This allows determination of $ZL_{ij}$ including quadratic terms. The first six steps ("Provide Reticle" through "Third Exposure") are word for word the same as in the fourth main embodiment. After the first six steps, we would have a wafer (FIG. 19) with multiple fields (six fields shown), each field containing 3-overlapped FF reticle exposures, each field schematically shown in FIG. 12 (Nx=5, Ny=7).

Rotate Wafer

Rotate wafer is the same as in the second main embodiment.

Fourth Exposure Series

This is the same as in the second main embodiment with the difference that we do an exposure at each field (FIG. 19) on the wafer. The appearance of each field after exposure is shown schematically in FIG. 16.

Develop Wafer

Develop wafer is the same as in the first main embodiment.

Measure Focusing Fiducials

At this point, focusing fiducials fields with four overlapped exposures (e.g., FIG. 16) are arranged at a number, Nf, of distinct fields (Nf=6 in FIG. 19). We now choose one field (say ifx=ify=1 for definiteness) and measure all relevant focusing fiducials in it and reduce them to FPD values. At all of the other fields we measure and reduce to FPD values at a minimum of three complete, non-collinear sites. These sites are preferably spaced as far as possible from one another in the X and Y directions (located at corners within the exposed field). Referring to FIG. 16, three suitable sites at (i, j)=(2, −2), (−1, −2), (−1, 2) are circled by dashed lines. Each of the sites is complete in that each contains FFs from each exposure series. Site (i, j)=(−2, −2) is an example of an incomplete site, it contains FFs only from the first, third, and fourth exposure series.

So at the end of the measurement and data reduction process we will have the following FPD values:

$\delta Z_{ij}(ifx,ify)$=FPD values from first exposure series at field (ifx, ify) $i=-mx:mx \ j=-my:my$ for (ifx, ify) =(1,1) (i,j)=(i1, j1), (i2, j2), (i3, j3) at other fields (Eq. 52)

$\delta Z_{ij}(ifx,ify)$=FPD values from second exposure series at field (ifx, ify) $i=-mx+1:mx \ j=-my:my$ for (ifx, ify)=(1,1) (i, j)=(i1, j1), (i2, j2), (i3, j3) at other fields (Eq. 53)

$\delta Z_{ij}(ifx,ify)$=FPD values from third exposure series at field (ifx, ify) $i=-mx:mx \ j=-my+1:my$ for (ifx, ify)=(1,1) (i, j)=(i1, j1), (i2, j2), (i3, j3) at other fields (Eq. 54)

$\delta Z_{ij}(ifx,ify)$=FPD values from fourth exposure series at field (ifx, ify) $i,j=-\min(mx:my):\min(mx, my)$ for (ifx, ify)=(1,1) (i, j)=(i1, j1), (i2, j2), (i3, j3) at other fields (Eq. 55)

Here, (i1, j1), (i2, j2), (i3, j3) are indices of the non-collinear triplet at the sparsely measured fields.

Reconstruct Lens Field Curvature

At this point, measured FPD values described in Equations 51, 52, 53 and 54 are combined to reconstruct the static lens field curvature. FPD values from the completely measured field ($\delta Z_{ij}(1,1)$, $\delta ZX_{ij}(1,1)$, $\delta ZY_{ij}(1,1)$, $\delta Z90_{ij}(1,1)$) are reconstructed using the procedures outlined in the second main embodiment to arrive at the lens distortion $ZL_{ij}$ to with a term in the form of Equation 16. Calling the numerically computed lens distortion from field (ifx, ify)=(1,1) $ZL^*_{ij}$ we first remove terms of the form a'+b'*i+c'*j+d'*($i^2+j^2$) from it using the procedure discussed for Equations 17 and 18. We next form the quantities specified by Equations 30 & 31 at the (i, j) pairs (i1, j1), (i2, j2), (i3, j=3) and fit the results to $$\alpha 1 + \beta 1^*i + \gamma 1^*j \text{ for Equation 30} \quad \text{(Equation 56)}$$

and $$\alpha 2 + \beta 2^*i + \gamma 2^*j \text{ for Equation 31} \quad \text{(Equation 57)}$$

The unknown quadratic part is then computed as:

$$d' = \frac{1}{4}[<b2>-<b1>+<c3>-<c1>-\beta 1 - \gamma 2] \quad \text{(Equation 58)}$$

So we get our final answer for $ZL_{ij}$:

$$ZL_{ij} = ZL^*_{ij} + d'(i^2 + j^2) \quad \text{(Equation 59)}$$

(FIG. 13) as well as the wafer flatness to within an a+b*x+c*y term in field (1,1) (FIG. 14), as well as the repeatable parts of wafer state tilt (FIG. 20).

SEVENTH MAIN EMBODIMENT

Figure 25:
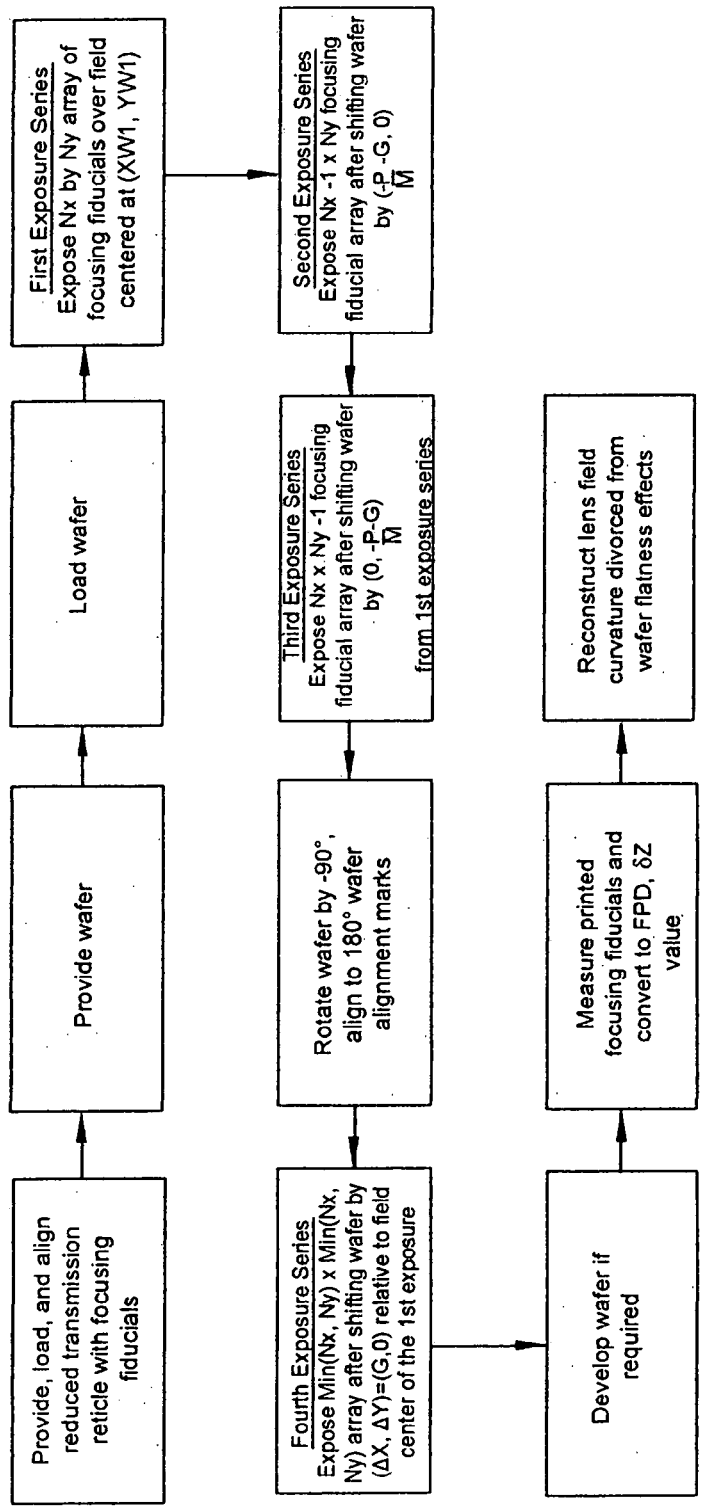
FIG. 25 shows process flow for another alternative embodiment.

FIG. 25 shows the seventh main embodiment of the present invention. The first six steps are identical to those of the fifth main embodiment. At the end of the sixth step, we have a single field (FIG. 12) of overlapped, printed focusing fiducials that have been created using successive sub-E0 exposures.

Rotate Wafer

Rotate wafer is the same as in the second main embodiment.

Fourth Exposure Series

This is identical to the fourth exposure series of the second main embodiment with the exception that as in the previous three exposure series we utilize multiple sub-E0 exposure doses to create the printed FFs ("' quantities in FIG. 16). At this point, the field is schematically as shown in FIG. 16.

Develop Wafer

Develop wafer is the same as in the first embodiment described above.

Measure Focusing Fiducials

Measure focusing fiducials is the same as in the second embodiment described above.

Reconstruct Lens Field Curvature

We have the measurements and Equations 47, 48, 49 of the fifth main embodiment as well as $$\delta Z90_{ij} = ZL_{j,-1} + ZW_{ij} + a + b^*i + c^*j \quad \text{(Equation 60)}$$

$i, j = -\min(mx, my) : \min(mx, my)$ where a, b, c are again the repeatable parts of the wafer stage piston and tilt. These equations are then solved, the piston and tilt positions of $ZL^*_{ij}$ removed (Equation 50) and the final result $ZL_{ij}$ (Equation 51) computed and shown as in FIG. 13. Wafer flatness $ZW_{ij}$ (FIG. 14) and stage tilt is also determined (FIG. 20).

Examples of an Apparatus for Processing the Final Output

Figure 26:
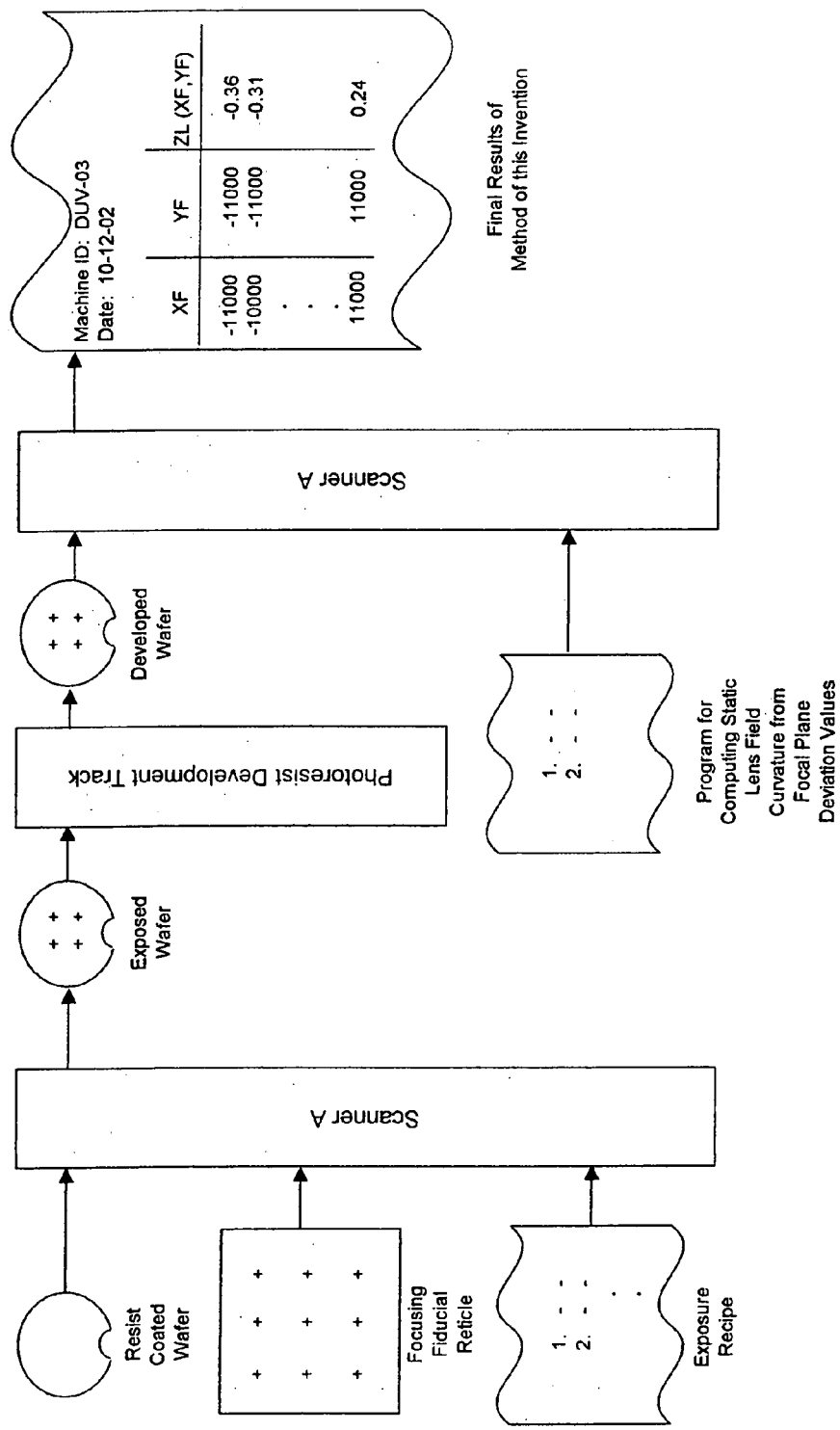
FIG. 26 is a block diagram illustrating a technique for processing the final output.

FIG. 26 is a block diagram illustrating a technique for processing the final output. As illustrated in FIG. 26, a resist coated wafer is loaded onto a scanner. In the example illustrated in FIG. 26, a scanner diagnoses itself for defects in static lens field curvature. The static lens field curvature information can then be used to correct the scanner, for example the scanner can adjust for the static lens curvature in response to the information. A reticle with focusing fiducials is also loaded onto the scanner. The scanner is then programmed to expose the focusing fiducials onto the wafer in accordance with a predetermined recipe from the method of this embodiment. After the wafer has the desired pattern exposed on it, the exposed wafer is sent through a photoresist track and developed. The developed wafer with the pattern of focusing fiducials is then loaded onto the scanner. The scanner is programmed to determine static lens field curvature using focal plane deviation values determined from the measurement of the focusing fiducials using the scanner (Scanner A in FIG. 26). The scanner then outputs the static lens field curvature values.

Figure 27:
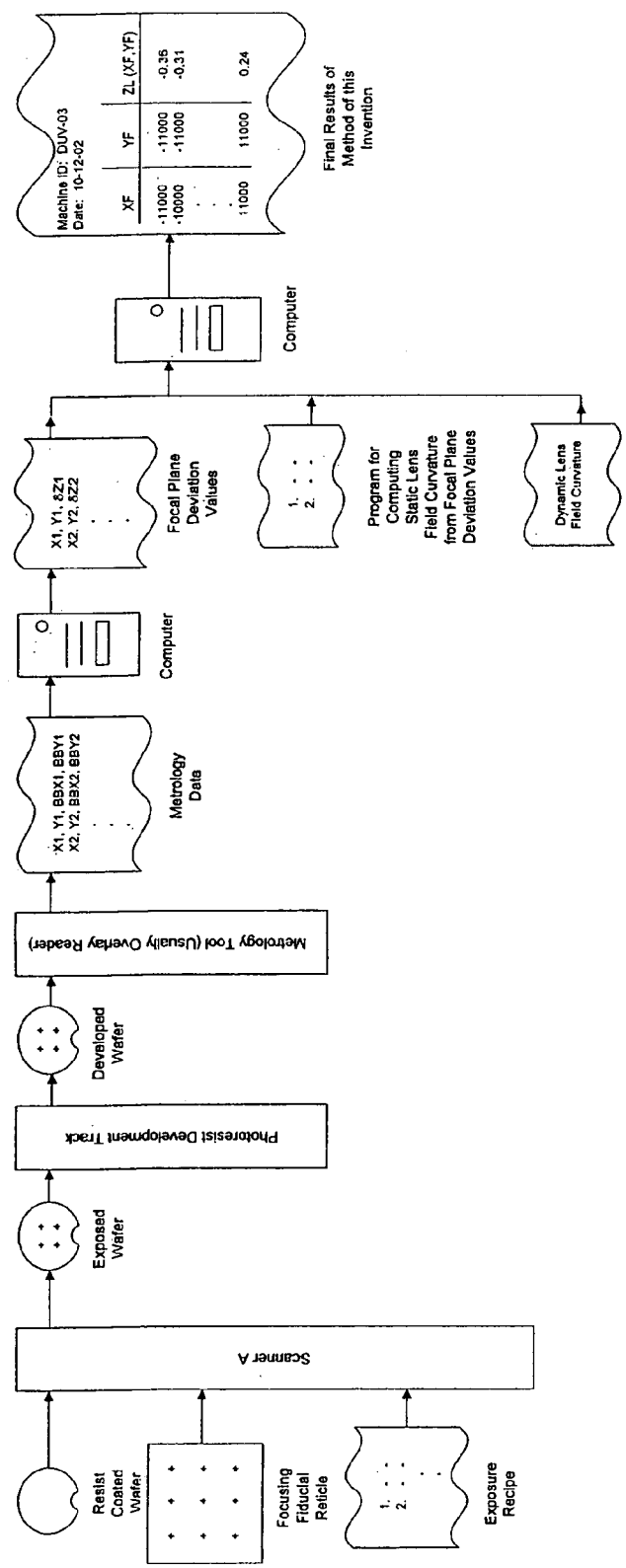
FIG. 27 is a block diagram illustrating another technique for processing the final output.

FIG. 27 is a block diagram illustrating another technique for processing the final output. In a manner similar to that described in FIG. 26, a resist coated wafer and a reticle with focusing fiducials are loaded onto a scanner. The focusing fiducials are then exposed onto the wafer in accordance with a predetermined recipe from the method of this embodiment. The exposed wafer is sent through a photoresist track and developed. In this technique, the developed wafer with the pattern of focusing fiducials is then loaded onto a metrology tool, such as an overlay reader. The metrology tool measures the developed fiducials and outputs metrology data that is fed into a processor or computer that converts the raw metrology data into focal plane deviation values. Another, or possibly the same, computer processes the focal plane deviation values to compute static lens field curvature. The computer then outputs the static lens field curvature values.

VARIATIONS OF THE MAIN EMBODIMENTS

Heretofore, we have referred to single exposures of the stepper as creating the necessary FFs on the wafer. Some technologies, such as PSFM, will produce FFs in a single exposure. See, for example, U.S. Pat. No. 5,300,786 supra. Technologies such as the In-Situ Interferometer typically require two separate exposures to create a single focusing fiducial. See, for example, U.S. Pat. No. 5,978,085 supra. One exposure creates the so-called "MA" pattern that is the carrier of the wafer, lens, and scanner height variation information, while the other exposure creates the so-called "MO" pattern. The MO pattern creates a reference so the resulting FF can be read in an overlay metrology tool. Since the MO does not carry any significant wafer lens or scanner height variation information, this second exposure, for the purposes of this invention, can be lumped together with the first or MA exposure.

Therefore, in the case of ISI technology being used for creating FFs, we would call the MA/MO exposure pair an exposure group. Then, in applying the two main embodiments to an ISI FF, the called for 'exposures' would be replaced by 'exposure groups', each exposure group consisting of an MA/MO pair made in accordance with the practice of the ISI FF technology. See, for example, U.S. Pat. No. 5,978,085 supra.

In the case of other technologies that require multiple exposures to create a single FF that can produce an FPD value, we would practice the present invention by designating the multiple exposures as a single exposure group and follow the method of this invention by using exposure groups where exposures are called for in the two main embodiments or their extensions.

Heretofore we have specified this invention with the wafer notch angles being specifically 180° and 270°. In practice, any two wafer notch angles differing by +90° or −90°, or other desired angles, could be used.

The process of this invention could be improved by taking into account reticle flatness effects. If we previously measure or otherwise know the reticle flatness and then provide it ($ZR_{ij}$), then, by subtracting it from the appropriate measured FPD value we can remove this source of inaccuracy. For example, in Equation 4, if $\delta Z_{ij}$ is replaced with $$\delta Z_{ij} = \delta Z_{ij} - ZR_{ij}/M^2 \quad \text{(Equation 61)}$$

and similarly (but shifted) for the other FPD values the subsequent discussions of this invention proceed word for word as here stated. M=reduction magnification ratio (typically 4 or 5).

The present invention applies to steppers or scanners that are operated in static exposure mode. It also applies to immersion projection imaging objectives and extreme ultraviolet (EUV) imaging systems.

So far, we have described the substrates on which the recording media is placed as wafers. This will be the case in semiconductor manufacture. The exact form of the substrate will be dictated by the projection lithography tool and its use in a specific manufacturing environment. Thus, in a flat panel manufacturing facility, the substrate on which the photoresist would be placed would be a glass plate or panel. A mask making tool would utilize a reticle as a substrate. Circuit boards or multi-chip module carriers are other possible substrates. Also, electronic recording media (CCD) could be used in lieu of a wafer.

While the present invention has been described in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

We claim:

1. A process for producing a static lens field curvature report in a photolithography projection imaging system, the process comprising:
    exposing a substrate at an exposure field to an array of focusing fiducials of a reticle of a resist exposure tool in a photolithography projection imaging system, wherein a corresponding first array of focusing fiducials is imaged onto the substrate;
    shifting the substrate in a first shifting operation;
    exposing the substrate at the exposure field to the array of focusing fiducials on the reticle in a second exposure operation, wherein a corresponding second array of focusing fiducials is imaged onto the substrate;
    shifting the substrate a second shifting operation;
    exposing the substrate at the exposure field to the array of focusing fiducials on the reticle in a third shifting operation, wherein a corresponding third array of focusing fiducials is imaged onto the substrate;
    determining static lens field curvature using one or more focal plane deviation values determined from measurements of the focusing fiducials; and
    producing a report from the static lens field curvature.

2. A process as described in claim 1, wherein the substrate comprises a semiconductor wafer, a glass plate, or an electronic recording media.

3. A process as described in claim 1, wherein the substrate comprises a recording media comprising a resist material, or an electronic CCD.

4. A process as described in claim 1, wherein the second array of focusing fiducials and the third array of focusing fiducials each comprises fewer focusing fiducials than the first array.

5. A process as described in claim 1, wherein the first array comprises an Nx*Ny array of focusing fiducials, the second array comprises an Nx−1*Ny array of focusing fiducials, and the third array comprises an Nx*Ny−1 array of focusing fiducials.

6. A process as described in claim 1, wherein the first shifting operation shifts the substrate in an X direction.

7. A process as described in claim 1, wherein the second shifting operation shifts the substrate in a Y direction.

8. A process as described in claim 1, wherein the resist exposure tool comprises a stepper, a scanner, an immersion projection imaging objective, or an extreme ultra-violet imaging apparatus.

9. A process as described in claim 1, wherein the reticle comprises a SCALPEL or EUV reticle, a reflective mask, or chrome patterned glass.

10. A process as described in claim 1, wherein the reticle comprises an array of focusing fiducials comprising a 2mx+1*2my+1 pattern.

11. A process as described in claim 10, wherein mx=2 and my=3.

12. A process as described in claim 10, wherein the array comprises an electrical test pattern, a box-in-box, frame-in-frame, segment-in-segment pattern, a segmented bar-in-bar pattern, a Schnitzl pattern, a FOCAL pattern, or a PSFM pattern.

13. A process as described in claim 1, wherein exposing the substrate comprises making multiple sub E0 exposures.

14. A process as described in claim 1, wherein the reticle includes a partially light reflective coating.

15. A process as described in claim 1, wherein the reticle includes a light absorbing coating.

16. A process as described in claim 1, wherein the reticle includes a mask with an active area comprising chrome and attenuated phase shift mask material.

17. A process as described in claim 1, further comprising rotating the substrate by a designed amount and exposing it to the array.

18. A process as described in claim 17, wherein the substrate is rotated by about 90°.

19. A process as described in claim 17, wherein exposing the substrate comprises multiple sub E0 exposures.

20. A process for producing a static lens field curvature report in a photolithography projection imaging system, the process comprising:
    exposing a substrate at an exposure field to an Nx*Ny array of focusing fiducials;
    exposing the substrate to an Nx−1*Ny array of focusing fiducials after shifting the substrate in a first shifting operation;
    exposing the substrate at the exposure field to an Nx*Ny−1 array of focusing fiducials after shifting the substrate in a second shifting operation;
    determining static lens field curvature using the one or more focal plane deviation values determined from measurements of the focusing fiducials; and
    producing a static lens field curvature report.

21. A process as described in claim 20, wherein the substrate comprises a semiconductor wafer, a glass plate, or an electronic recording media.

22. A process as described in claim 20, wherein the substrate comprises a recording media, the recording media comprising a resist material, or an electronic CCD.

23. A process as described in claim 20, wherein the substrate is shifted in an X direction with respect to the array of focusing fiducials during the first shifting operation.

24. A process as described in claim 20, wherein the substrate is shifted in a Y direction with respect to the array of focusing fiducials during the second shifting operation.

25. A process as described in claim 20, wherein exposing the substrate comprises multiple sub E0 exposures.

26. A process as described in claim 20, further comprising rotating the substrate by a desired amount and exposing it to the array.

27. A process as described in claim 26, wherein the substrate is rotated by about 90°.

28. A process as described in claim 26, wherein the fourth exposure operation comprises multiple sub E0 exposures.

29. A process for producing a static lens field curvature report in a photolithography projection imaging system, the process comprising:

exposing a substrate at an exposure field to a plurality of fields on a reticle of a resist exposure tool, wherein each field comprises an array of focusing fiducials, and wherein a corresponding first set of plurality of fields is imaged onto the substrate in a first exposure operation;

shifting the substrate in a first shifting operation;

exposing the substrate at the exposure field to the plurality of fields in a second exposure operation, wherein a corresponding second set of plurality of fields is imaged onto the substrate;

shifting the substrate in a second shifting operation;

exposing the substrate at the exposure field to the plurality of fields in a third exposure operation, wherein a corresponding third set of plurality of fields is imaged onto the substrate;

determining static lens field curvature using the one or more focal plane deviation values determined from measurements of the focusing fiducials; and producing a report from the static lens field curvature.

30. A process as described in claim 29, wherein the substrate comprises a semiconductor wafer, a glass plate, or an electronic recording media.

31. A process as described in claim 29, wherein the substrate comprises a recording media, the recording media comprising a resist material, or an electronic CCD.

32. A process as described in claim 29, wherein in the first set of plurality of fields each field comprises an Nx*Ny array of focusing fiducials, in the second set of plurality of fields each field comprises an Nx−1*Ny array of focusing fiducials, and in the third set of plurality of fields each field comprises an Nx*Ny−1 array of focusing fiducials.

33. A process as described in claim 29, wherein the substrate is shifted in an X direction at the first shifting operation.

34. A process as described in claim 29, wherein the substrate is shifted in a Y direction at the second shifting operation.

35. A process as described in claim 29, wherein the resist exposure tool comprises a stepper, a scanner, an immersion projection imaging objective, or an extreme ultra-violet imaging apparatus.

36. A process as described in claim 29, wherein the reticle comprises a SCALPEL or EUV reticle, a reflective mask, or a chrome patterned glass.

37. A process as described in claim 29, wherein each of the plurality of fields contains an array of focusing fiducials comprising a 2mx+1*2my+1 pattern.

38. A process as described in claim 37, wherein mx=2 and my=3.

39. A process as described in claim 37, wherein each of the arrays comprises an electrical test pattern, a box-in-box, frame-in-frame, segment-in-segment pattern, a segmented bar-in-bar pattern, a Schnitzl pattern, a FOCAL pattern, or a PSFM pattern.

40. A process as described in claim 29, wherein exposing the substrate comprises multiple sub E0 exposures.

41. A process as described in claim 29, wherein the reticle includes a partially light reflective coating.

42. A process as described in claim 29, wherein the reticle includes a light absorbing coating.

43. A process as described in claim 29, wherein the reticle includes a mask with an active area comprising chrome and attenuated phase shift mask material.

44. A process for producing a static lens field curvature report in a photolithography projection imaging system, the process comprising:

exposing a substrate at an exposure field to a plurality of fields on a reticle of a resist exposure tool of the projection imaging system, wherein each field comprises an array of focusing fiducials, and wherein a corresponding first set of plurality of fields is imaged onto the substrate;

shifting the substrate in a first shifting operation;

exposing the substrate at the exposure field to the plurality of fields in a second exposure operation, wherein a corresponding second set of plurality of fields imaged onto the substrate;

shifting the substrate in a second shifting operation;

exposing the substrate at the exposure field to the plurality of fields in a third exposure operation, wherein a corresponding third set of plurality of fields is imaged onto the substrate;

measuring all of the focusing fiducials in a first field imaged onto the substrate and converting the measurements to one or more focal plane deviation values;

measuring three separate, non-collinear focusing fiducials in each of the remaining fields and converting the measurements into focal plane deviation values;

determining static lens field curvature using the measured focal plane deviation values; and producing a report from the static lens field curvature.

45. A process as described in claim 44, wherein the substrate comprises a semiconductor wafer, a glass plate, or an electronic recording media.

46. A process as described in claim 44, wherein the substrate comprises a recording media, the recording media comprising a resist material, or an electronic CCD.

47. A process as described in claim 44, wherein in the first set of plurality of fields each field comprises an Nx*Ny array of focusing fiducials, in the second set of plurality of fields each field comprises an Nx−1*Ny array of focusing fiducials, and in the third set of plurality of fields each field comprises an Nx*Ny−1 array of focusing fiducials.

48. A process as described in claim 44, wherein the substrate is shifted in an X direction at the first shifting operation.

49. A process as described in claim 44, wherein the substrate is shifted in a Y direction at the second shifting operation.

50. A process as described in claim 44, wherein the resist exposure tool comprises a stepper, a scanner, an immersion projection imaging objective, or an extreme ultra-violet imaging apparatus.

51. A process as described in claim 44, wherein the reticle comprises a SCALPEL or EUV reticle, a reflective mask, or a chrome patterned glass.

52. A process as described in claim 44, wherein each of the plurality of fields contains an array of focusing fiducials comprising a 2mx+1*2my+1 pattern.

53. A process as described in claim 52, wherein mx=2 and my=3.

54. A process as described in claim 52, wherein each of the arrays comprises an electrical test pattern, a box-in-box, frame-in-frame, segment-in-segment pattern, a segmented bar-in-bar pattern, a Schnitzl pattern, a FOCAL pattern, or a PSFM pattern.

55. A process as described in claim 44, wherein exposing the substrate comprises multiple sub E0 exposures.

56. A process as defined in claim 44, wherein the reticle includes a partially light reflective coating.

57. A process as described in claim 44, wherein the reticle includes a light absorbing coating.

58. A process as described in claim 44, wherein the reticle includes a mask with an active area comprising chrome and attenuated phase shift mask material.

59. A process as described in claim 44, further comprises rotating the substrate by a desired amount and exposing it to the array.

60. A process as described in claim 59, wherein the substrate is rotated by about 90°.

61. A process as described in claim 59, wherein the fourth exposure operation comprises multiple sub E0 exposures.

62. A process for producing a static lens field curvature report in a photolithography projection imaging system, the process comprising:
submitting a substrate to a first series of exposures at an exposure field from an array of focusing fiducials on a reduced transmission focusing fiducial reticle of a resist exposure tool, wherein a corresponding first array of focusing fiducials is imaged onto the substrate;
shifting the substrate in a first shifting operation;
submitting the substrate at the exposure field to a second series of exposures to the array of focusing fiducials on the reticle, wherein a corresponding second array of focusing fiducials is imaged onto the substrate;
shifting the substrate in a second shifting operation;
submitting the substrate at the exposure field to a third series of exposures to the array of focusing fiducials on the reticle, wherein a corresponding third array of focusing fiducials is imaged onto the substrate;
determining static lens field curvature using one or more focal plane deviation values determined from measurement of the focusing fiducials; and
producing a report from the static lens field curvature.

63. A process as described in claim 62, wherein the exposures comprise multiple sub E0 exposures.

64. A process as described in claim 62, wherein the substrate comprises a semiconductor wafer, a glass plate, or an electronic recording media.

65. A process as described in claim 62, wherein the substrate comprises a recording media, the recording media comprising a resist material, or an electronic CCD.

66. A process as described in claim 62, wherein the second array of focusing fiducials and the third array of focusing fiducials each comprises fewer focusing fiducials than the first array.

67. A process as described in claim 62, wherein the first array comprises an Nx*Ny array of focusing fiducials, the second array comprises an Nx−1*Ny array of focusing fiducials, and the third array comprises an Nx*Ny−1 array of focusing fiducials.

68. A process as described in claim 62, wherein the substrate is shifted in an X direction at the first shifting operation.

69. A process as described in claim 62, wherein the substrate is shifted in a Y direction at the second shifting operation.

70. A process as described in claim 62, wherein the resist exposure tool comprises a stepper, a scanner, an immersion projection imaging objective, or an extreme ultra-violet imaging apparatus.

71. A process as described in claim 62, wherein the reticle comprises a SCALPEL or EUV reticle, a reflective mask, or chrome patterned glass.

72. A process as described in claim 62, wherein the reticle comprises an array of focusing fiducials comprising a 2mx+1*2my+1 pattern.

73. A process as described in claim 72, wherein mx=2 and my=3.

74. A process as described in claim 72, wherein the array comprises an electrical test pattern, a box-in-box, frame-in-frame, segment-in-segment pattern, a segmented bar-in-bar pattern, a Schnitzl pattern, a FOCAL pattern, or a PSFM pattern.

75. A process as described in claim 62, further comprises rotating the substrate a desired amount and exposing it to the array.

76. A process as described in claim 75, wherein the substrate is rotated by about 90°.

77. A process as described in claim 75, wherein the fourth exposure operation comprises multiple sub E0 exposures.

78. A method of producing a photolithographic chip mask work from a photolithography projection imaging system, the method comprising:
projecting a desired mask work reticle in the projection imaging system;
determining lens field curvature of the photolithography projection imaging system by performing operations comprising
exposing a substrate at an exposure field to an array of focusing fiducials of a reticle of a resist exposure tool in a photolithography projection imaging system, wherein a corresponding first array of focusing fiducials is imaged onto the substrate,
shifting the substrate in a first shifting operation,
exposing the substrate at the exposure field to the array of focusing fiducials on the reticle in a second exposure operation, wherein a corresponding second array of focusing fiducials is imaged onto the substrate,
shifting the substrate a second shifting operation,
exposing the substrate at the exposure field to the array of focusing fiducials on the reticle in a third shifting operation, wherein a corresponding third array of focusing fiducials is imaged onto the substrate,
determining static lens field curvature using one or more focal plane deviation values determined from measurements of the focusing fiducials; and
producing a photolithographic chip mask work in accordance with the determined static lens field curvature.

79. A method as described in claim 78, wherein the second array of focusing fiducials and the third array of focusing fiducials each comprises fewer focusing fiducials than the first array.

80. A method as described in claim 78, wherein the first array comprises an Nx*Ny array of focusing fiducials, the second array comprises an Nx−1*Ny array of focusing fiducials, and the third array comprises an Nx*Ny−1 array of focusing fiducials.

81. A method as described in claim 78, wherein the substrate is shifted in an X direction at the first shifting operation.

82. A method as described in claim 78, wherein the substrate is shifted in a Y direction at the second shifting operation.

83. A method as described in claim 78, wherein the resist exposure tool comprises a stepper, a scanner, an immersion projection imaging objective, or an extreme ultra-violet imaging apparatus.

84. A method as described in claim 78, wherein the reticle comprises an array of focusing fiducials comprising a 2mx+1*2my+1 pattern.

85. A method as described in claim 84, wherein mx=2 and my=3.

86. A method as described in claim 78, wherein the array comprises an electrical test pattern, a box-in-box, frame-in-frame, segment-in-segment pattern, a segmented bar-in-bar pattern, a Schnitzl pattern, a FOCAL pattern, or a PSFM pattern.

87. A method as described in claim 78, wherein exposing the substrate comprises making multiple sub E0 exposures.

88. A method as described in claim 78, further comprising rotating the substrate by a desired amount and exposing it to the array.

89. A method as described in claim 88, wherein the substrate is rotated by about 90°.

90. A method as described in claim 88, wherein exposing the array comprises multiple sub E0 exposures.

91. An apparatus for determining static lens field curvature of a photolithographic projection imaging system, the apparatus comprising:

a computer that receives data from a developed substrate the computer configured to accept metrology data wherein the data is obtained from measuring a substrate with exposed focusing fiducials and to output static lens field curvature in accordance with focal plane deviation values based on measurements of the focusing fiducials on the substrate, the focal plane deviation values being independent of substrate flatness effects.

92. The apparatus of claim 91, wherein the substrate is a semiconductor wafer.

93. The apparatus of claim 91, wherein the substrate is a glass plate.

94. The apparatus of claim 91, wherein the substrate is an electronic recording media.

\* \* \* \* \*